United States Patent
Yagita et al.

(10) Patent No.: US 9,236,222 B2
(45) Date of Patent: Jan. 12, 2016

(54) ION IMPLANTATION APPARATUS AND ION IMPLANTATION METHOD

(71) Applicant: Sumitomo Heavy Industries Ion Technology Co., Ltd., Tokyo (JP)

(72) Inventors: Takanori Yagita, Ehime (JP); Mitsuaki Kabasawa, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/732,239

(22) Filed: Jun. 5, 2015

(65) Prior Publication Data

US 2015/0357160 A1 Dec. 10, 2015

(30) Foreign Application Priority Data

Jun. 9, 2014 (JP) .................. 2014-118901

(51) Int. Cl.
*H01J 37/317* (2006.01)
*H01J 37/147* (2006.01)
*H01J 37/10* (2006.01)

(52) U.S. Cl.
CPC ............. *H01J 37/3171* (2013.01); *H01J 37/10* (2013.01); *H01J 37/147* (2013.01); *H01J 2237/103* (2013.01)

(58) Field of Classification Search
USPC .................................................. 250/492.21
See application file for complete search history.

(56) References Cited

U.S. PATENT DOCUMENTS

| | | | |
|---|---|---|---|
| 5,151,605 A | 9/1992 | Politiek et al. | |
| 6,930,316 B2 | 8/2005 | Nishihashi et al. | |
| 7,718,980 B2 | 5/2010 | Tsukihara et al. | |
| 7,982,192 B2 | 7/2011 | Tsukihara et al. | |
| 8,008,636 B2 | 8/2011 | Eisner | |
| 8,330,125 B2 | 12/2012 | Chang et al. | |
| 8,946,659 B2 | 2/2015 | Abs et al. | |
| 2008/0121822 A1* | 5/2008 | Fujita | H01J 37/1475 250/492.21 |
| 2009/0206270 A1* | 8/2009 | Glayish et al. | H01J 37/05 250/396 ML |
| 2015/0123005 A1 | 5/2015 | Abs et al. | |

FOREIGN PATENT DOCUMENTS

| | | |
|---|---|---|
| JP | 62-122045 A | 6/1987 |
| JP | 01-149960 A | 6/1989 |
| JP | H04-226021 A | 8/1992 |
| JP | 2003-208869 A | 7/2003 |
| JP | 2008-269961 A | 11/2008 |
| JP | 2011-501858 A | 1/2011 |
| JP | 2012-513089 A | 6/2012 |
| JP | 5085887 B2 | 11/2012 |
| JP | 2013-537359 A | 9/2013 |

* cited by examiner

*Primary Examiner* — Kiet T Nguyen
(74) *Attorney, Agent, or Firm* — Michael Best & Friedrich LLP

(57) ABSTRACT

An ion implantation apparatus includes a beam scanning unit and a beam parallelizing unit arranged downstream thereof. The beam scanning unit has a scan origin in a central part of the scanning unit on a central axis of an incident ion beam. The beam parallelizing unit has a focal point of a parallelizing lens at the scan origin. The ion implantation apparatus is configured such that a focal position of the incident beam into the scanning unit is located upstream of the scan origin along the central axis of the incident beam. The focal position of the incident beam into the scanning unit is adjusted to be at a position upstream of the scan origin along the central axis of the incident beam such that a divergence phenomenon caused by the space charge effect in an exiting ion beam from the parallelizing unit is compensated.

8 Claims, 16 Drawing Sheets

ION IMPLANTATION APPARATUS AND ION IMPLANTATION METHOD

RELATED APPLICATION

Priority is claimed to Japanese Patent Application No. 2014-118901, filed on Jun. 9, 2015, the entire content of which is incorporated herein by reference.

BACKGROUND OF THE INVENTION

1. Field of the Invention

The present invention relates to an ion implantation, and more particularly to an ion implantation apparatus and an ion implantation method.

2. Description of the Related Art

In a certain ion implantation apparatus, an ion source is connected to a power supply thereof such that an ion beam having a small amount of beam current is extracted from the ion source. In this apparatus, the connection between the ion source and the power supply may be modified such that an ion beam having a large amount of beam current is extracted from the ion source.

Another ion implantation apparatus includes an ion source, an acceleration tube, and an electric circuit connecting power supplies thereof, so as to implant ions into a target at high ion energy. The electric circuit is provided with a selector switch for switching the connection so as to implant ions at low ion energy.

Attempts to extend the operating range of the ion implantation apparatus to some degree have been made as described above. However, a realistic proposal to the extension of the operating range beyond the existing categories is rare.

Generally, ion implantation apparatuses are classified into three categories: a high-current ion implantation apparatus, a medium-current ion implantation apparatus, and a high energy ion implantation apparatus. Since practical design requirements are different for each category, an apparatus of one category and an apparatus of another category may have significantly different configurations in, for example, beamline. Therefore, in the use of the ion implantation apparatus (for example, in a semiconductor manufacturing process), it is considered that apparatuses of different categories have no compatibility. That is, for particular ion implantation processing, an apparatus of a particular category is selected and used. Therefore, for a variety of ion implantation processing, it is necessary to own various types of ion implantation apparatuses.

SUMMARY OF THE INVENTION

An exemplary object of an aspect of the present invention is to provide an ion implantation apparatus and an ion implantation method which can be used in a wide range, for example, an ion implantation apparatus which can serve as both a high-current ion implantation apparatus and a medium-current ion implantation apparatus, and an ion implantation method.

According to an embodiment of the present invention, there is provided an ion implantation apparatus comprising: a beam scanning unit that has a scan origin in a central part of the beam scanning unit on a central axis of an incident ion beam; and a beam parallelizing unit arranged downstream of the beam scanning unit, the beam parallelizing unit that has a focal point of a parallelizing lens at the scan origin, wherein the ion implantation apparatus is configured such that a focal position of the incident ion beam into the beam scanning unit is located upstream of the scan origin along the central axis of the incident ion beam, and wherein the focal position of the incident ion beam toward the beam scanning unit is adjusted to be at a position upstream of the scan origin along the central axis of the incident ion beam in such a manner that a divergence phenomenon caused by a space charge effect in an exiting ion beam from the beam parallelizing unit is compensated.

According to another embodiment of the present invention, there is provided an ion implantation apparatus comprising: a beam scanning unit that has a scan origin in a central part of the beam scanning unit on a central axis of an incident ion beam; a beam parallelizing unit arranged downstream of the beam scanning unit, the beam parallelizing unit that has a focal point of a parallelizing lens at the scan origin; a measurement unit that measures a beam divergence indicating both an extent of spread of angular distribution of an exiting ion beam from the beam parallelizing unit and a state of beam convergence/divergence of the exiting ion beam; and a control unit that compares the beam divergence of the exiting ion beam measured by the measurement unit against a desired value and adjusts a focal position of the incident ion beam toward the beam scanning unit along the central axis of the incident ion beam such that the beam divergence corresponds to the desired value.

According to still another embodiment of the present invention, there is provided an ion implantation method employed in an ion implantation apparatus comprising a beam scanning unit that has a scan origin in a central part of the beam scanning unit on a central axis of an incident ion beam, and a beam parallelizing unit arranged downstream of the beam scanning unit, the beam parallelizing unit that has a focal point of a parallelizing lens at the scan origin, the method comprising: scanning the incident ion beam by the beam scanning unit; deflecting the scanned ion beam by the beam parallelizing unit; and adjusting a focal position of the incident ion beam to be at a position upstream of the scan origin along the central axis of the incident ion beam in such a manner that a divergence phenomenon caused by a space charge effect in an exiting ion beam from the beam parallelizing unit is compensated.

According to still another embodiment of the present invention, there is provided an ion implantation method employed in an ion implantation apparatus comprising a beam scanning unit that has a scan origin in a central part of the beam scanning unit on a central axis of an incident ion beam, and a beam parallelizing unit arranged downstream of the beam scanning unit, the beam parallelizing unit that has a focal point of a parallelizing lens at the scan origin, the method comprising: scanning the incident ion beam by the beam scanning unit; deflecting the scanned ion beam by the beam parallelizing unit; measuring a beam divergence indicating both an extent of spread of angular distribution of an exiting ion beam from the parallelizing lens and a state of beam convergence/divergence of the exiting ion beam; and comparing the measured beam divergence of the exiting ion beam against a desired value, and thereafter, adjusting a focal position of the incident ion beam toward the beam scanning unit along the central axis of the incident ion beam such that the beam divergence corresponds to the desired value.

Optional combinations of the aforementioned constituting elements, and implementations of the invention in the form of methods, apparatuses, systems, computer programs and so forth may also be practiced as additional modes of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
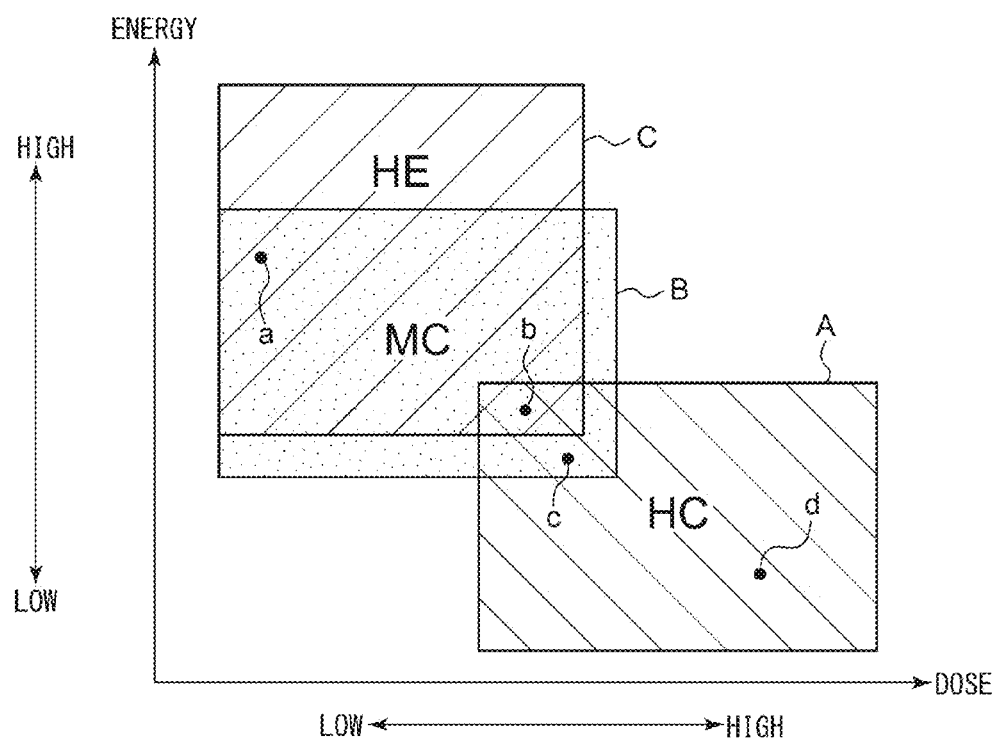
FIG. 1 is a diagram schematically illustrating ranges of an energy and a dose amount in several types of typical ion implantation apparatuses.

The invention will now be described by reference to the preferred embodiments. This does not intend to limit the scope of the present invention, but to exemplify the invention.

Hereinafter, embodiments of the present invention will be described in detail with reference to the drawings. Also, in the description of the drawings, the same reference numerals are assigned to the same components, and a redundant description thereof is appropriately omitted. Also, the configurations described below are exemplary, and do not limit the scope of the present invention. For example, in the following, a semiconductor wafer is described as an example of an object to which an ion implantation is performed, but other materials or members may also be used.

First, a description will be given of circumstances that led to an embodiment of the present invention to be described below. An ion implantation apparatus can select an ion species to be implanted and set an energy and a dose amount thereof, based on desired properties to be established within a workpiece. Generally, ion implantation apparatuses are classified into several categories according to the ranges of energy and dose amount of ions to be implanted. As representative categories, there are a high-dose high-current ion implantation apparatus (hereinafter, referred to as HC), a medium-dose medium-current ion implantation apparatus (hereinafter, referred to as MC), and a high energy ion implantation apparatus (hereinafter, referred to as HE).

FIG. 1 schematically illustrates the energy ranges and the dose ranges of a typical serial-type high-dose high-current ion implantation apparatus HC, a serial-type medium-dose medium-current ion implantation apparatus MC, and a serial-type high energy ion implantation apparatus HE. In FIG. 1, a horizontal axis represents the dose, and a vertical axis represents the energy. The dose is the number of ions (atoms) implanted per unit area (for example, $cm^2$), and the total amount of implanted material is provided by a time integral of ion current. The ion current provided by the ion implantation is generally expressed as mA or μA. The dose is also referred to as an implantation amount or a dose amount. In FIG. 1, the energy and dose ranges of the HC, the MC, and the HE are indicated by symbols A, B, and C, respectively. These are a set range of implantation conditions required according to implantation conditions (also called a recipe) for each implantation, and represent practically reasonable apparatus configuration categories matched with the implantation conditions (recipe), considering practically allowable productivity. Each of the illustrated ranges represents an implantation condition (recipe) range that can be processed by the apparatus of each category. The dose amount represents an approximate value when a realistic processing time is assumed.

The HC is used for ion implantation in a relatively low energy range of about 0.1 to 100 keV and in a high dose range of about $1 \times 10^{14}$ to $1 \times 10^{17}$ atoms/$cm^2$. The MC is used for ion implantation in a medium energy range of about 3 to 500 keV and in a medium dose range of about $1 \times 10^{11}$ to $1 \times 10^{14}$ atoms/$cm^2$. The HE is used for ion implantation in a relatively high energy range of about 100 keV to 5 MeV and in a relatively low dose range of about $1 \times 10^{10}$ to $1 \times 10^{13}$ atoms/$cm^2$. In this way, the broad ranges of the implantation conditions having about five digits for the energy range and about seven digits for the dose ranges are shared by the HC, the MC, and the HE. However, these energy ranges or dose ranges are a representative example, and are not strict. Also, the way of providing the implantation conditions is not limited to the dose and the energy, but is various. The implantation conditions may be set by a beam current value (representing an area integral beam amount of a beam cross-sectional profile by a current), a throughput, implantation uniformity, and the like.

Since the implantation conditions for ion implantation processing include particular values of energy and dose, the implantation conditions can be expressed as individual points in FIG. 1. For example, an implantation condition a has values of a high energy and a low dose. The implantation condition a is in the operating range of the MC and is also in the operating range of the HE. The ion implantation can be processed accordingly using the MC or the HE. An implantation condition b is a medium energy/dose and the ion implantation can be processed by one of the HC, MC, and HE. An implantation condition c is a medium energy/dose and the ion implantation can be processed by the HC or the MC. An implantation condition d is a low energy/a high dose and can be processed by only the HC.

The ion implantation apparatus is an equipment essential to the production of semiconductor devices, and the improvement of performance and productivity thereof has an important meaning to a device maker. The device maker selects an apparatus, which is capable of realizing implantation characteristics necessary for a device to be manufactured, among a plurality of ion implantation apparatus categories. At this time, the device maker determines the number of apparatuses of the category, considering various circumstances such as the realization of the best manufacturing efficiency, the cost of ownership of the apparatus, and the like.

It is assumed that an apparatus of a certain category is used at a high operating rate and an apparatus of another category has a relatively sufficient processing capacity. At this time, if the former apparatus cannot be replaced with the latter apparatus in order to obtain a desired device because implantation characteristics are strictly different for each category, the failure of the former apparatus cause a bottleneck on production processes, and thus overall productivity is impaired. Such trouble may be avoided to some extent by assuming a failure rate and the like in advance and determining a number configuration based on that.

When a manufacturing device is changed due to a change in demand or a technical advance and the number configuration of necessary apparatuses is changed, apparatuses become lacking or a non-operating apparatus occurs and thus an operating efficiency of the apparatuses may be reduced. Such trouble may be avoided to some extent by predicting the trend of future products and reflecting the predicted trend to the number configuration.

Even though the apparatus can be replaced with an apparatus of another category, the failure of the apparatus or the change of the manufacturing device may reduce the production efficiency or lead to wasted investment for the device maker. For example, in some cases, a manufacturing process having been mainly processed till now by a medium-current ion implantation apparatus is processed by a high-current ion implantation apparatus due to the change of the manufacturing device. If doing so, the processing capacity of the high-current ion implantation apparatus becomes lacking, and the processing capacity of the medium-current ion implantation apparatus becomes surplus. If it is expected that the state after the change will not change for a long period of time, the operating efficiency of the apparatus can be improved by taking measures of purchasing a new high-current ion implantation apparatus and selling the medium-current ion implantation apparatus having been owned. However, when a process is frequently changed, or such a change is difficult to predict, a trouble may be caused in production.

In practice, a process having already been performed in an ion implantation apparatus of a certain category in order to manufacture a certain device cannot be immediately used in an ion implantation apparatus of another category. This is because a process of matching device characteristics on the ion implantation apparatus is required. That is, device characteristics obtained by performing a process with the same ion species, energy, and dose amount in the new ion implantation apparatus may be significantly different from device characteristics obtained in the previous ion implantation apparatus. Various conditions other than the ion species, the energy, and the dose amount, for example, a beam current density (that is, a dose rate), an implantation angle, or an overspray method of an implantation region, also affect the device characteristics. Generally, when the categories are different, apparatus configurations also are different. Therefore, even though the ion species, the energy, and the dose amount are specified, it is impossible to automatically match the other conditions affecting the device characteristics. These conditions depend on implantation methods. Examples of the implantation methods include a method of relative movement between a beam and a workpiece (for example, a scanning beam, a ribbon beam, a two-dimensional wafer scanning, or the like), a batch type and a serial type to be described below.

In addition, rough classification of the high-dose high-current ion implantation apparatus and the high energy ion implantation apparatus into a batch type and the medium-dose medium-current ion implantation apparatus into a serial type also increases a difference between the apparatuses. The batch type is a method of processing a plurality of wafers at one time, and these wafers are disposed on, for example, the circumference. The serial type is a method of processing wafers one by one and is also called a single wafer type. Also, in some cases, the high-dose high-current ion implantation apparatus and the high energy ion implantation apparatus are configured as the serial type.

Also, a beamline of the batch-type high-dose high-current ion implantation apparatus is typically made shorter than that of the serial-type medium-dose medium-current ion implantation apparatus by a request on beamline design according to high-dose high-current beam characteristics. This is done for suppressing beam loss caused by divergence of ion beams in a low energy/high beam current condition in the design of the high-dose high-current beamline. In particular, this is done for reducing a tendency to expand outward in a radial direction, so-called a beam blow-up, because ions forming the beam include charged particles repelling each other. The necessity for such design is more remarkable when the high-dose high-current ion implantation apparatus is the batch type than when that is the serial type.

The beamline of the serial-type medium-dose medium-current ion implantation apparatus is made relatively long for ion beam acceleration or beam forming. In the serial-type medium-dose medium-current ion implantation apparatus, ions having considerable momentum are moving at high speed. The momentum of the ions increases while the ions pass through one or several of acceleration gaps added to the beamline. Also, in order to modify a trajectory of particles having considerable momentum, a focusing portion needs to be relatively long enough to fully apply a focusing power.

Since the high energy ion implantation apparatus adopts a linear acceleration method or a tandem acceleration method, it is essentially different from an acceleration method of the high-dose high-current ion implantation apparatus or the medium-dose medium-current ion implantation apparatus. This essential difference is equally applied when the high energy ion implantation apparatus is the serial type or the batch type.

As such, the ion implantation apparatuses HC, MC and HE are recognized as completely different apparatuses because the beamline types or the implantation methods are different according to categories. A difference in configuration between apparatuses of different categories is recognized as inevitable. Among the different types of apparatuses such as HC, MC and HE, process compatibility considering the influence on the device characteristics is not guaranteed.

Therefore, it is preferable that the ion implantation apparatus has a broader energy range and/or dose range than the apparatus of the existing category. In particular, it is desirable to provide an ion implantation apparatus capable of implantation in a broad range of energy and dose amount including at least two existing categories, without changing the type of the implantation apparatus.

Also, in recent years, the mainstream is that all implantation apparatuses adopt the serial type. It is therefore desirable to provide an ion implantation apparatus that has a serial-type configuration and also has a broad energy range and/or dose range.

Also, the HE uses an essentially different acceleration method, and the HC and the MC are common in that ion beams are accelerated or decelerated by a DC voltage. Therefore, there is a probability that the HC and the MC can share the beamline. It is therefore desirable to provide an ion implantation apparatus that can serve as both the HC and the MC.

The apparatus capable of operating at a broad range helps to improve productivity or operating efficiency in view of device makers.

Also, the medium-current ion implantation apparatus MC can operate in a high energy range and a low dose range as compared with the high-current ion implantation apparatus HC. Therefore, in this application, the medium-current ion implantation apparatus MC is also referred to as a low-current ion implantation apparatus. Likewise, regarding the medium-current ion implantation apparatus MC, the energy and the dose are also referred to as high energy and low dose, respectively. Alternatively, regarding the high-current ion implantation apparatus HC, the energy and the dose are also referred to as low energy and high dose, respectively. However, these expressions in this application are not intended to restrictively indicate only the energy range and the dose range of the medium-current ion implantation apparatus MC, but may mean "a high (or low) energy (or dose) range" literally according to the context.

Figure 2:
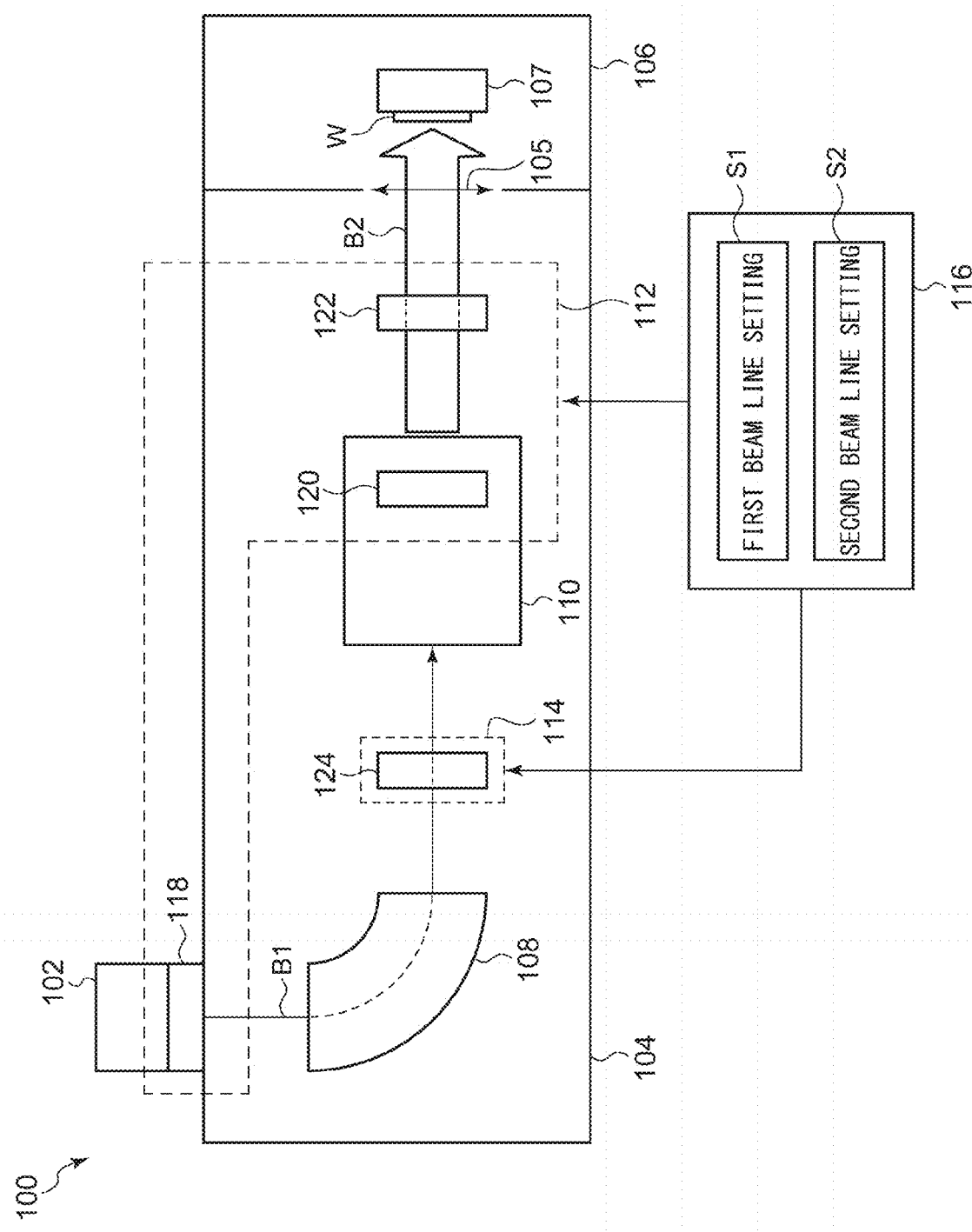
FIG. 2 is a diagram schematically illustrating an ion implantation apparatus according to an embodiment of the present invention.

FIG. 2 is a diagram schematically illustrating an ion implantation apparatus 100 according to an embodiment of the present invention. The ion implantation apparatus 100 is configured to perform ion implantation processing on a surface of a workpiece W according to given ion implantation conditions. The ion implantation conditions include, for example, an ion species to be implanted into the workpiece W, an ion dose amount, and ion energy. The workpiece W is, for example, a substrate, or, for example, a wafer. Therefore, in the following, the workpiece W is also referred to as a substrate W for convenience of description. This is not intended to limit a target of the implantation processing to a particular object.

The ion implantation apparatus 100 includes an ion source 102, a beamline device 104, and an implantation processing chamber 106. Also, the ion implantation apparatus 100 includes a vacuum exhaust system (not illustrated) for providing desired vacuum environments to the ion source 102, the beamline device 104, and the implantation processing chamber 106.

The ion source 102 is configured to generate ions to be implanted into the substrate W. The ion source 102 provides the beamline device 104 with an ion beam B1 accelerated and extracted from the ion source 102 by an extraction electrode unit 118 that is an example of a component for adjusting a beam current. Hereinafter, this may be also referred to as an initial ion beam B1.

The beamline device 104 is configured to transport ions from the ion source 102 to the implantation processing chamber 106. The beamline device 104 provides a beamline for transporting the ion beam. The beamline is a passage of the ion beam and may be also said as a path of beam trajectory. The beamline device 104 performs operations including deflection, acceleration, deceleration, shaping, and scanning, with respect to the initial ion beam B1, thereby forming an ion beam B2. Hereinafter, this may be also referred to as an implantation ion beam B2. The beamline device 104 includes a plurality of beamline components arranged for such beam operations. In this manner, the beamline device 104 provides the implantation processing chamber 106 with the implantation ion beam B2.

The implantation ion beam B2 has a beam irradiation region 105 in the plane perpendicular to a beam transportation direction (or a direction along a beam trajectory) of the beamline device 104. Generally, the beam irradiation region 105 has a width including the width of the substrate W. For example, when the beamline device 104 includes a beam scanning device scanning a spot-shaped ion beam, the beam irradiation region 105 is an elongated irradiation region extending over a scanning range along a longitudinal direction perpendicular to the beam transportation direction. Also, likewise, when the beamline device 104 includes a ribbon beam generator, the beam irradiation region 105 is an elongated irradiation region extending in a longitudinal direction perpendicular to the beam transportation direction. However, the elongated irradiation region is a cross-section of a corresponding ribbon beam. The elongated irradiation region is longer than the width (diameter when the substrate W is circular) of the substrate W in a longitudinal direction.

The implantation processing chamber 106 includes a workpiece holder 107 holding the substrate W such that the substrate W receives the implantation ion beam B2. The workpiece holder 107 is configured to move the substrate W in a direction perpendicular to the beam transportation direction of the beamline device 104 and the longitudinal direction of the beam irradiation region 105. That is, the workpiece holder 107 provides a mechanical scan of the substrate W. In this application, the mechanical scan is the same as reciprocating motion. Also, the "perpendicular direction" is not limited to only a strict right angle. For example, when the implantation is performed in a state in which the substrate W is inclined in a vertical direction, the "perpendicular direction" may include such an inclined angle.

The implantation processing chamber 106 is configured as a serial-type implantation processing chamber. Therefore, the workpiece holder 107 typically holds one sheet of the substrate W. However, like the batch type, the workpiece holder 107 may include a support holding a plurality of (for example, small) substrates, and may be configured to mechanically scan the plurality of substrates by linearly reciprocating the support. In another embodiment, the implantation processing chamber 106 may be configured as a batch-type implantation processing chamber. In this case, for example, the workpiece holder 107 may include a rotating disk that rotatably holds a plurality of substrates W on the circumference of the disk. The rotating disk may be configured to provide a mechanical scanning.

Figure 3:
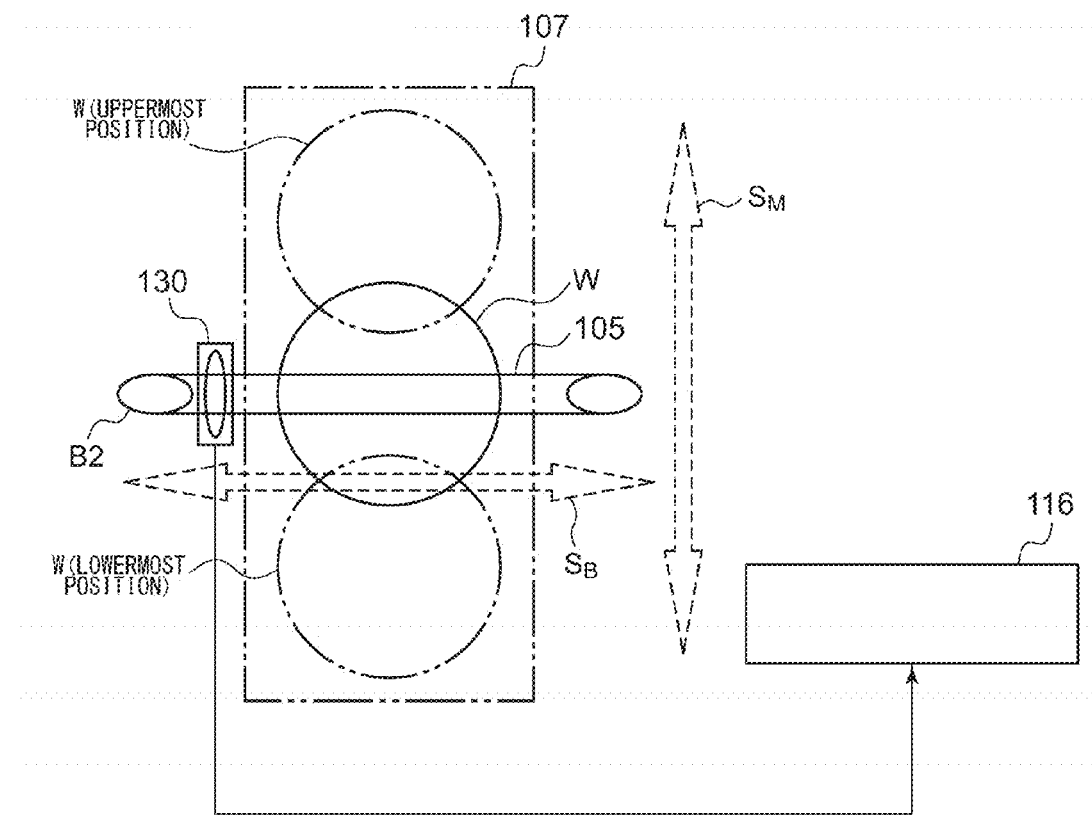
FIG. 3 is a diagram schematically illustrating an ion implantation apparatus according to an embodiment of the present invention.

FIG. 3 illustrates an example of the beam irradiation region 105 and the relevant mechanical scanning. The ion implantation apparatus 100 is configured to perform ion implantation by a hybrid scanning method using both one-dimensional beam scanning $S_B$ of the spot-shaped ion beam B2 and one-dimensional mechanical scanning $S_M$ of the substrate W. On the side of the workpiece holder 107, a beam measurement device 130 (for example, Faraday cup) is provided to overlap the beam irradiation region 105, and the measurement result may be provided to a control unit 116.

In this manner, the beamline device 104 is configured to supply the implantation processing chamber 106 with the implantation ion beam B2 having the beam irradiation region 105. The beam irradiation region 105 is formed to irradiate the implantation ion beam B2 across the substrate W in cooperation with the mechanical scanning of the substrate W. Therefore, ions can be implanted into the substrate W by the relative movement of the substrate W and the ion beam.

In another embodiment, the ion implantation apparatus 100 is configured to perform ion implantation by a ribbon beam+wafer scanning method using both the ribbon-shaped ion beam B2 and the one-dimensional mechanical scanning of the substrate W. The horizontal width of the ribbon beam is expanded while maintaining uniformity, and the substrate W is scanned so as to intersect with the ribbon beam. In a further embodiment, the ion implantation apparatus 100 may be configured to perform ion implantation by a method of two-dimensionally mechanically scanning the substrate W in a state in which the beam trajectory of the spot-shaped ion beam B2 is fixed.

Also, the ion implantation apparatus 100 is not limited to a particular implantation method for implanting ions across a broad region on the substrate W. An implantation method using no mechanical scanning is also possible. For example, the ion implantation apparatus 100 may be configured to perform ion implantation by a two-dimensional beam scanning method of two-dimensionally scanning the substrate W with the spot-shaped ion beam B2. Alternatively, the ion implantation apparatus 100 may be configured to perform ion implantation by a large-size beam method using the two-dimensionally expanded ion beam B2. The large-size beam is expanded to make a beam size equal to or larger than a substrate size while maintaining uniformity, and can process the entire substrate at one time.

Although details will be described below, the ion implantation apparatus 100 may be operated under a first beamline setting S1 for high-dose implantation or a second beamline setting S2 for low-dose implantation. Therefore, the beamline device 104 has the first beamline setting S1 or the second beamline setting S2 during operations. The two settings are determined to generate the ion beams for different ion implantation conditions under the common implantation method. Thus, in the first beamline setting S1 and the second beamline setting S2, the beam center trajectories being the reference of the ion beams B1 and B2 are identical to each other. The beam irradiation regions 105 are also identical to each other in the first beamline setting S1 and the second beamline setting S2.

The beam center trajectory being the reference refers to a beam trajectory when beam is not scanned in the beam scanning method. Also, in the case of the ribbon beam, the beam center trajectory being the reference corresponds to a locus of a geometric center of a beam cross-section.

The beamline device 104 may be divided into a beamline upstream part on the ion source 102 side and a beamline downstream part on the implantation processing chamber 106 side. In the beamline upstream part, for example, a mass spectrometer 108 including a mass analysis magnet and a mass analysis slit is provided. The mass spectrometer 108 performs mass spectrometry on the initial ion beam B1 and provides only necessary ion species to the beamline downstream part. In the beamline downstream part, for example, a beam irradiation region determination unit 110 is provided to determine the beam irradiation region 105 of the implantation ion beam B2.

The beam irradiation region determination unit 110 is configured to emit the ion beam having the beam irradiation region 105 (for example, the implantation ion beam B2) by applying either (or both) of an electric field and a magnetic field to the incident ion beam (for example, the initial ion beam B1). In an embodiment, the beam irradiation region determination unit 110 includes a beam scanning device and a beam parallelizing device. Examples of the beamline components will be described below with reference to FIG. 5.

Also, it should be understood that the division into the upstream part and the downstream part, as above-described, is mentioned for conveniently describing a relative position relationship of the components in the beamline device 104. Therefore, for example, a component in the beamline downstream part may be disposed at a place closer to the ion source 102 away from the implantation processing chamber 106. The opposite holds true as well. Therefore, in an embodiment, the beam irradiation region determination unit 110 may include a ribbon beam generator and a beam parallelizing device, and the ribbon beam generator may include the mass spectrometer 108.

The beamline device 104 includes an energy adjustment system 112 and a beam current adjustment system 114. The energy adjustment system 112 is configured to adjust implantation energy to the substrate W. The beam current adjustment system 114 is configured to adjust the beam current in a broad range so as to change a dose amount implanted into the substrate W in a broad range. The beam current adjustment system 114 is provided to adjust the beam current of the ion beam quantitatively (rather than qualitatively). In an embodiment, the adjustment of the ion source 102 can be also used to adjust the beam current. In this case, the beam current adjustment system 114 may be considered to include the ion source 102. Details of the energy adjustment system 112 and the beam current adjustment system 114 will be described below.

Also, the ion implantation apparatus 100 includes a control unit 116 for controlling all or part of the ion implantation apparatus 100 (for example, all or part of the beamline device 104). The control unit 116 is configured to select any one from a plurality of beamline settings including the first beamline setting S1 and the second beamline setting S2, and operate the beamline device 104 under the selected beamline setting. Specifically, the control unit 116 sets the energy adjustment system 112 and the beam current adjustment system 114 according to the selected beamline setting, and controls the energy adjustment system 112 and the beam current adjustment system 114. Also, the control unit 116 may be a dedicated controller for controlling the energy adjustment system 112 and the beam current adjustment system 114.

The control unit 116 is configured to select a beamline setting suitable for given ion implantation conditions among the plurality of beamline settings including the first beamline setting S1 and the second beamline setting S2. The first beamline setting S1 is suitable for transport of a high-current beam for high-dose implantation into the substrate W. Therefore, for example, the control unit 116 selects the first beamline setting S1 when a desired ion dose amount implanted into the substrate W is in the range of about $1 \times 10^{14}$ to $1 \times 10^{17}$ atoms/$cm^2$. Also, the second beamline setting S2 is suitable for transport of a low-current beam for low-dose implantation into the substrate. Therefore, for example, the control unit 116 selects the second beamline setting S2 when a desired ion dose amount implanted into the substrate W is in the range of about $1\times10^{11}$ to $1\times10^{14}$ atoms/cm$^2$. Details of the beamline settings will be described below.

The energy adjustment system 112 includes a plurality of energy adjustment elements arranged along the beamline device 104. The plurality of energy adjustment elements is disposed at fixed positions on the beamline device 104. As illustrated in FIG. 2, the energy adjustment system 112 includes, for example, three adjustment elements, specifically, an upstream adjustment element 118, an intermediate adjustment element 120, and a downstream adjustment element 122. Each of these adjustment elements includes one or more electrodes configured to exert an electric field for accelerating or decelerating the initial ion beam B1 and/or the implantation ion beam B2.

The upstream adjustment element 118 is provided in the upstream part of the beamline device 104, for example, the most upstream part of the beamline device 104. The upstream adjustment element 118 includes, for example, an extraction electrode system for extracting the initial ion beam B1 from the ion source 102 to the beamline device 104. The intermediate adjustment element 120 is installed in the middle portion of the beamline device 104 and includes, for example, an electrostatic beam parallelizing device. The downstream adjustment element 122 is provided in the downstream part of the beamline device 104 and includes, for example, an acceleration/deceleration column. The downstream adjustment element 122 may include an angular energy filter (AEF) disposed in the downstream of the acceleration/deceleration column.

Also, the energy adjustment system 112 includes a power supply system for the above-described energy adjustment elements. This will be described below with reference to FIGS. 6 and 7. Also, the plurality of energy adjustment elements may be provided in any number anywhere on the beamline device 104, which is not limited to the illustrated arrangement. Also, the energy adjustment system 112 may include only one energy adjustment element.

The beam current adjustment system 114 is provided in the upstream part of the beamline device 104, and includes a beam current adjustment element 124 for adjusting the beam current of the initial ion beam B1. The beam current adjustment element 124 is configured to block at least a portion of the initial ion beam B1 when the initial ion beam B1 passes through the beam current adjustment element 124. In an embodiment, the beam current adjustment system 114 may include a plurality of beam current adjustment elements 124 arranged along the beamline device 104. Also, the beam current adjustment system 114 may be provided in the downstream part of the beamline device 104.

The beam current adjustment element 124 includes a movable portion for adjusting a passage region of the ion beam cross-section perpendicular to the beam transportation direction of the beamline device 104. According to the movable portion, the beam current adjustment element 124 constitutes a beam limiting device having a variable-width slit or a variable-shape opening for limiting a portion of the initial ion beam B1. Also, the beam current adjustment system 114 includes a driving device for continuously or discontinuously adjusting the movable portion of the beam current adjustment element 124.

Additionally or alternatively, the beam current adjustment element 124 may include a plurality of adjustment members (for example, adjustment aperture) each having a plurality of beam passage regions having different areas and/or shapes. The beam current adjustment element 124 may be configured to switch the adjustment member disposed on the beam trajectory among the plurality of adjustment members. In this manner, the beam current adjustment element 124 may be configured to adjust the beam current stepwise.

As illustrated, the beam current adjustment element 124 is a beamline component separate from the plurality of energy adjustment elements of the energy adjustment system 112. By separately installing the beam current adjustment element and the energy adjustment element, the beam current adjustment and the energy adjustment may be individually performed. This may increase the degree of freedom in the setting of the beam current range and the energy range in the individual beamline settings.

The first beamline setting S1 includes a first energy setting for the energy adjustment system 112 and a first beam current setting for the beam current adjustment system 114. The second beamline setting S2 includes a second energy setting for the energy adjustment system 112 and a second beam current setting for the beam current adjustment system 114. The first beamline setting S1 is directed to the low energy and high-dose ion implantation, and the second beamline setting S2 is directed to the high energy and low-dose ion implantation.

Therefore, the first energy setting is determined to be suitable for the transport of the low energy beam as compared with the second energy setting. Also, the second beam current setting is determined to reduce the beam current of the ion beam as compared with the first beam current setting. By combining the beam current adjustment and the irradiation time adjustment of the implantation ion beam B2, a desired dose amount can be implanted into the substrate W.

The first energy setting includes a first power supply connection setting that determines the connection between the energy adjustment system 112 and the power supply system thereof. The second energy setting includes a second power supply connection setting that determines the connection between the energy adjustment system 112 and the power supply system thereof. The power supply connection settings are determined such that the intermediate adjustment element 120 and/or the downstream adjustment element 122 generate an electric field for helping the beam transport. For example, the beam parallelizing device and/or the acceleration/deceleration column, as a whole, are configured to decelerate the implantation ion beam B2 under the first energy setting and accelerate the implantation ion beam B2 under the second energy setting. Due to the power supply connection settings, a voltage adjustment range of each adjustment element of the energy adjustment system 112 is determined. In the adjustment range, a voltage of the power supply corresponding to each adjustment element can be adjusted to provide a desired implantation energy to the implantation ion beam B2.

The first beam current setting includes a first opening setting that determines the ion beam passage region of the beam current adjustment element 124. The second beam current setting includes a second opening setting that determines the ion beam passage region of the beam current adjustment element 124. The second opening setting is determined such that the ion beam passage region is small as compared with the first opening setting. The opening settings determine, for example, the movable range of the movable portion of the beam current adjustment element 124. Alternatively, the opening settings may determine the adjustment member to be used. In this manner, the ion beam passage region corresponding to the desired beam current within the adjustment range determined by the opening settings may be set to the beam current adjustment element 124. The ion beam passage region can be adjusted such that a desired dose amount is implanted into the substrate W within a processing time permitted to the ion implantation processing.

Thus, the beamline device 104 has a first energy adjustment range under the first beamline setting S1 and has a second energy adjustment range under the second beamline setting S2. In order to enable a broad range of the adjustment, the first energy adjustment range has a portion overlapping the second energy adjustment range. That is, two adjustment ranges overlap each other in at least the ends thereof. The overlapping portion may be a straight-line in the diagram schematically illustrating range of an energy and dose of ion implantation apparatuses. In this case, two adjustment ranges contact each other. In another embodiment, the first energy adjustment range may be separated from the second energy adjustment range.

Likewise, the beamline device 104 has a first dose adjustment range under the first beamline setting S1 and has a second dose adjustment range under the second beamline setting S2. The first dose adjustment range has a portion overlapping the second dose adjustment range. That is, two adjustment ranges overlap each other in at least the ends thereof. The overlapping portion may be a straight-line in the diagram schematically illustrating range of an energy and dose of ion implantation apparatuses. In this case, two adjustment ranges contact each other. In another embodiment, the first dose adjustment range may be separated from the second dose adjustment range.

In this manner, the beamline device 104 is operated in a first operation mode under the first beamline setting S1. The first operation mode may be referred to as a low energy mode (or a high-dose mode). Also, the beamline device 104 is operated in a second operation mode under the second beamline setting S2. The second operation mode may be referred to as a high energy mode (or a low-dose mode). The first beamline setting S1 can be also referred to as a first implantation setting configuration suitable for the transport of a low energy/high-current beam for the high-dose implantation into the workpiece W. The second beamline setting S2 can be also referred to as a second implantation setting configuration suitable for the transport of a high energy/low-current beam for the low-dose implantation into the workpiece W.

An operator of the ion implantation apparatus 100 can switch the beamline settings before a certain ion implantation processing is performed, depending on the implantation conditions of the processing. Therefore, the broad range from the low energy (or high-dose) to the high energy (or low-dose) can be processed by one ion implantation apparatus.

Also, the ion implantation apparatus 100 corresponds to the broad range of the implantation conditions in the same implantation method. That is, the ion implantation apparatus 100 processes a broad range with substantially the same beamline device 104. Also, the ion implantation apparatus 100 has the serial-type configuration that is recently becoming the mainstream. Therefore, although details will be described below, the ion implantation apparatus 100 is suitable for use as a shared unit of the existing ion implantation apparatuses (for example, HC and MC).

The beamline device 104 can also be considered to include a beam control device for controlling the ion beam, a beam conditioning device for conditioning the ion beam, and a beam shaping device for shaping the ion beam. The beamline device 104 supplies the ion beam having the beam irradiation region 105 exceeding the width of the workpiece W in the implantation processing chamber 106 by using the beam control device, the beam conditioning device, and the beam shaping device. In the ion implantation apparatus 100, the beam control device, the beam conditioning device, and the beam shaping device may have the same hardware configuration in the first beamline setting S1 and the second beamline setting S2. In this case, the beam control device, the beam conditioning device, and the beam shaping device may be disposed with the same layout in the first beamline setting S1 and the second beamline setting S2. Therefore, the ion implantation apparatus 100 may have the same installation floor area (so-called footprint) in the first beamline setting S1 and the second beamline setting S2.

The beam center trajectory being the reference is a beam trajectory that is a locus of geometric center of the beam cross-section without beam scanning in the beam scanning method. Also, in the case of the ribbon beam that is a stationary beam, the beam center trajectory being the reference corresponds to a locus of a geometric center of the beam cross-section, regardless of a change in the beam cross-sectional shape in the implantation ion beam B2 of the downstream part.

The beam control device may include the control unit 116. The beam conditioning device may include the beam irradiation region determination unit 110. The beam conditioning device may include an energy filter or a deflection element. The beam shaping device may include a first XY convergence lens 206, a second XY convergence lens 208, and a Y convergence lens 210, which are to be described below.

It can be considered that, in the case of the beam scanning method, the initial ion beam B1 takes a single beam trajectory in the upstream part of the beamline device 104, and in the downstream part the implantation ion beam B2 takes a plurality of beam trajectories due to the beam scanning and parallelizing with reference to the beam center trajectory being the reference. However, in the case of the ribbon beam, it becomes a beam irradiation zone because the beam cross-sectional shape of the single beam trajectory is changed and the beam width is widened. Thus, the beam trajectory is also single. According to this view, the beam irradiation region 105 may be also referred to as an ion beam trajectory zone. Therefore, in the ion implantation apparatus 100, the implantation ion beam B2 has the same ion beam trajectory zone in the first beamline setting S1 and the second beamline setting S2.

Figure 4:
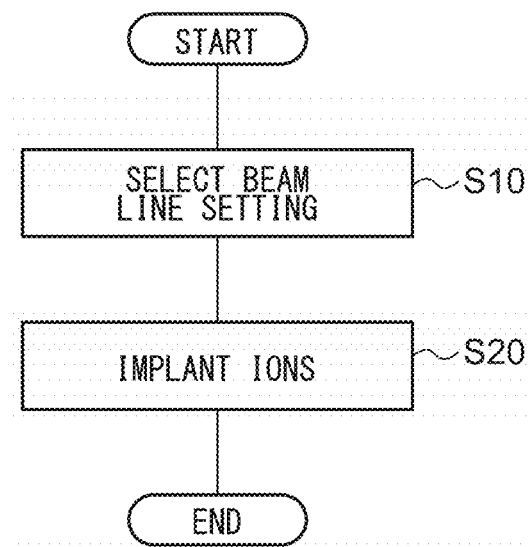
FIG. 4 is a flowchart illustrating an ion implantation method according to an embodiment of the present invention.

FIG. 4 is a flowchart illustrating an ion implantation method according to an embodiment of the present invention. This ion implantation method is suitable for use in the ion implantation apparatus 100. This method is performed by the control unit 116. As illustrated in FIG. 4, this method includes a beamline setting selecting step (S10) and an ion implantation step (S20).

The control unit 116 selects a beamline setting suitable for given ion implantation conditions among a plurality of beamline settings (S10). As described above, the plurality of beamline settings includes a first beamline setting S1 suitable for transport of a high-current beam for high-dose implantation into a workpiece, and a second beamline setting S2 suitable for transport of a low-current beam for low-dose implantation into a workpiece. For example, the control unit 116 selects the first beamline setting S1 when a desired ion dose amount implanted into a substrate W exceeds a threshold value, and selects the second beamline setting S2 when the desired ion dose amount is smaller than the threshold value. Also, as described below, the plurality of beamline settings (or implantation setting configurations) may include a third beamline setting (or third implantation setting configuration) and/or a fourth beamline setting (or fourth implantation setting configuration).

When the first beamline setting S1 is selected, the control unit 116 sets the energy adjustment system 112 by using the first energy setting. The energy adjustment system 112 and the power supply thereof are connected according to a first power supply connection setting. Also, the control unit 116 sets the beam current adjustment system 114 by using the first beam current setting. Therefore, the ion beam passage region (or adjustment range thereof) is set according to the first opening setting. Likewise, when the second beamline setting S2 is selected, the control unit 116 sets the energy adjustment system 112 by using the second energy setting, and sets the beam current adjustment system 114 by using the second beam current setting.

The selecting process step may include a process step of adjusting the beamline device 104 in the adjustment range according to the selected beamline setting. In the adjusting process step, each adjustment element of the beamline device 104 is adjusted within a corresponding adjustment range so as to generate the ion beam of a desired implantation condition. For example, the control unit 116 determines a voltage of a power supply corresponding to each adjustment element of the energy adjustment system 112 so as to obtain a desired implantation energy. Also, the control unit 116 determines the ion beam passage region of the beam current adjustment element 124 so as to obtain a desired implantation dose amount.

In this manner, the control unit 116 operates the ion implantation apparatus 100 under the selected beamline setting (S20). The implantation ion beam B2 having the beam irradiation region 105 is generated and supplied to the substrate W. The implantation ion beam B2 scans the entire substrate W in cooperation with the mechanical scanning of the substrate W (or with the beam alone). As a result, ions are implanted into the substrate W at the energy and dose amount of the desired ion implantation conditions.

The serial-type high-dose high-current ion implantation apparatus, which is being used in device production, currently adopts a hybrid scanning method, a two-dimensional mechanical scanning method, and a ribbon beam+wafer scanning method. However, the two-dimensional mechanical scanning method has a limitation in increase of a scanning speed due to a load of mechanical driving mechanism of the mechanical scanning, and thus, the two-dimensional mechanical scanning method disadvantageously cannot suppress implantation non-uniformity sufficiently. Also, in the ribbon beam+wafer scanning method, uniformity is easily degraded when the beam size is expanded in a horizontal direction. Therefore, in particular, there are problems in the uniformity and the identity of beam angle in the low-dose condition (low beam current condition). However, when the obtained implantation result is within an allowable range, the ion implantation apparatus of the present invention may be configured by the two-dimensional mechanical scanning method or the ribbon beam+wafer scanning method.

On the other hand, the hybrid scanning method can achieve excellent uniformity in the beam scanning direction by adjusting the beam scanning speed at high accuracy. Also, by performing the beam scanning at a sufficient high speed, implantation non-uniformity in the wafer scanning direction can be sufficiently suppressed. Therefore, the hybrid scanning method is considered as optimal over a broad range of the dose condition.

FIG. 5A is a plan view illustrating a schematic configuration of an ion implantation apparatus 200 according to an embodiment of the present invention, and FIG. 5B is a side view illustrating a schematic configuration of an ion implantation apparatus 200 according to an embodiment of the present invention. The ion implantation apparatus 200 is an embodiment when the hybrid scanning method is applied to the ion implantation apparatus 100 illustrated in FIG. 2. Also, like the ion implantation apparatus 100 illustrated in FIG. 2, the ion implantation apparatus 200 is a serial-type apparatus.

As illustrated, the ion implantation apparatus 200 includes a plurality of beamline components. The beamline upstream part of the ion implantation apparatus 200 includes, in order from the upstream side, an ion source 201, a mass analysis magnet 202, a beam dump 203, a resolving aperture 204, a current suppression mechanism 205, a first XY convergence lens 206, a beam current measurement device 207, and a second XY convergence lens 208. An extraction electrode 218 (see FIGS. 6 and 7) for extracting ions from the ion source 201 is provided between the ion source 201 and the mass analysis magnet 202.

A scanner 209 is provided between the beamline upstream part and the beamline downstream part. The beamline downstream part includes, in order from the upstream side, a Y convergence lens 210, a beam parallelizing mechanism 211, an AD (Accel/Decel) column 212, and an energy filter 213. A wafer 214 is disposed in the most downstream part of the beamline downstream part. The beamline components from the ion source 201 to the beam parallelizing mechanism 211 are accommodated in a terminal 216.

The current suppression mechanism 205 is an example of the above-described beam current adjustment system 114. The current suppression mechanism 205 is provided for switching a low-dose mode and a high-dose mode. The current suppression mechanism 205 includes, for example, a continuously variable aperture (CVA). The CVA is an aperture capable of adjusting an opening size by a driving mechanism. Therefore, the current suppression mechanism 205 is configured to operate in a relatively small opening size adjustment range in the low-dose mode, and operate in a relatively large opening size adjustment range in the high-dose mode. In an embodiment, in addition or alternative to the current suppression mechanism 205, a plurality of resolving apertures 204 having different opening widths may be configured to operate with different settings in the low-dose mode and the high-dose mode.

The current suppression mechanism 205 serves to help beam adjustment under the low beam current condition by limiting an ion beam amount arriving at the downstream. The current suppression mechanism 205 is provided in the beamline upstream part (that is, from the ion extraction from the ion source 201 to the upstream side of the scanner 209). Therefore, the beam current adjustment range can be increased. Also, the current suppression mechanism 205 may be provided in the beamline downstream part.

The beam current measurement device 207 is, for example, a movable flag Faraday.

The first XY convergence lens 206, the second XY convergence lens 208, and the Y convergence lens 210 constitute the beam shaping device for adjusting the beam shape in the vertical and horizontal directions (beam cross-section in an XY plane). As such, the beam shaping device includes a plurality of lenses arranged along the beamline between the mass analysis magnet 202 and the beam parallelizing mechanism 211. The beam shaping device can use the convergence/divergence effect of these lenses in order to appropriately transport the ion beam up to the downstream in a broad range of energy/beam current condition. That is, the ion beam can be appropriately transported to the wafer 214 in any condition of low energy/low beam current, low energy/high beam current, high energy/low beam current, and high energy/high beam current.

The first XY convergence lens 206 is, for example, a Q lens. The second XY convergence lens 208 is, for example, an XY-direction einzel lens. The Y convergence lens 210 is, for example, a Y-direction einzel lens or Q lens. Each of the first XY convergence lens 206, the second XY convergence lens 208, and the Y convergence lens 210 may be a single lens or a group of lenses. In this manner, the beam shaping device is designed to appropriately control the ion beam from the low energy/high beam current condition having a beam self-divergence problem caused by a large beam potential to the high energy/low beam current having a beam cross-sectional shape control problem caused by a small beam potential.

The energy filter 213 is, for example, an angular energy filter (AEF) having a deflection electrode or a deflection electromagnet, or both of the defection electrode and the deflection electromagnet.

The ions generated in the ion source 201 are accelerated with an extraction electric field (not illustrated). The accelerated ions are deflected in the mass analysis magnet 202. In this manner, only ions having a predetermined energy and a mass-to-charge ratio pass through the resolving aperture 204. Subsequently, the ions are guided to the scanner 209 through the current suppression mechanism (CVA) 205, the first XY convergence lens 206, and the second XY convergence lens 208.

The scanner 209 reciprocally scans the ion beam in a horizontal direction (which may be a vertical direction or an oblique direction) by applying either (or both) of a periodic electric field and a periodic magnetic field. Due to the scanner 209, the ion beam is adjusted such that the ion beam is uniformly implanted in a horizontal direction on the wafer 214. The traveling direction of the ion beam 215 with which the scanner 209 scans can be parallelized by the beam parallelizing mechanism 211 using the application of either (or both) of the electric field and the magnetic field. Thereafter, the ion beam 215 is accelerated or decelerated to have a predetermined energy in the AD column 212 by applying the electric field. The ion beam 215 exiting the AD column 212 reaches the final implantation energy (in the low energy mode, the energy may be adjusted to be higher than the implantation energy, and the ion beam may be deflected while decelerating in the energy filter). The energy filter 213 in the downstream of the AD column 212 deflects the ion beam 215 to the wafer 214 by the application of either (or both) of the electric field and the magnetic field with the deflection electrode or the deflection electromagnet. Thus, a contamination with energy other than target energy is eliminated. In this manner, the purified ion beam 215 is implanted into the wafer 214.

Also, the beam dump 203 is disposed between the mass analysis magnet 202 and the resolving aperture 204. The beam dump 203 deflects the ion beam by applying the electric field when necessary. Therefore, the beam dump 203 can control the arrival of the ion beam at the downstream at high speed.

Figure 5:
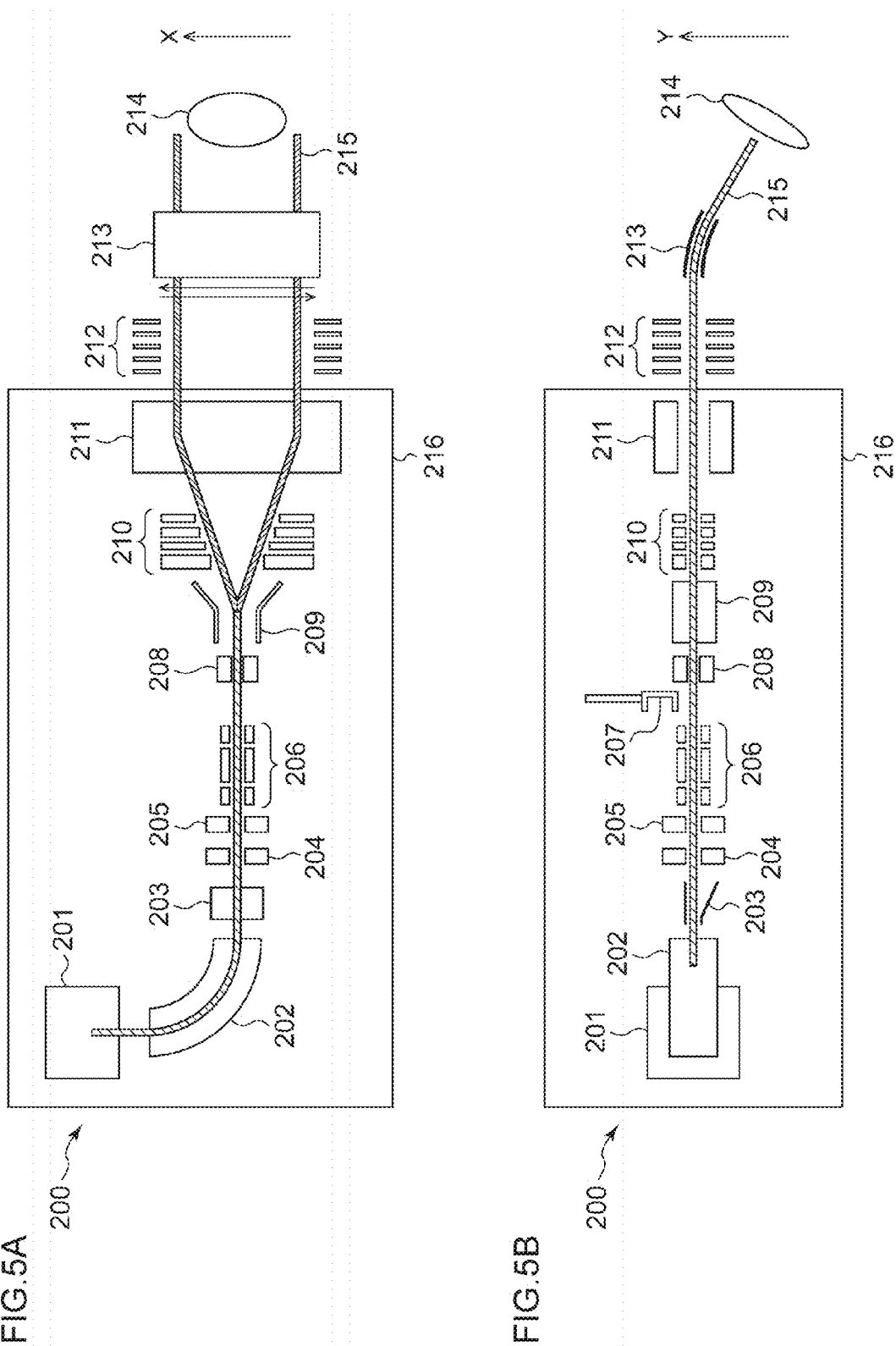
FIG. 5A is a plan view illustrating a schematic configuration of an ion implantation apparatus according to an embodiment of the present invention.
FIG. 5B is a side view illustrating a schematic configuration of an ion implantation apparatus according to an embodiment of the present invention.
Figure 6:
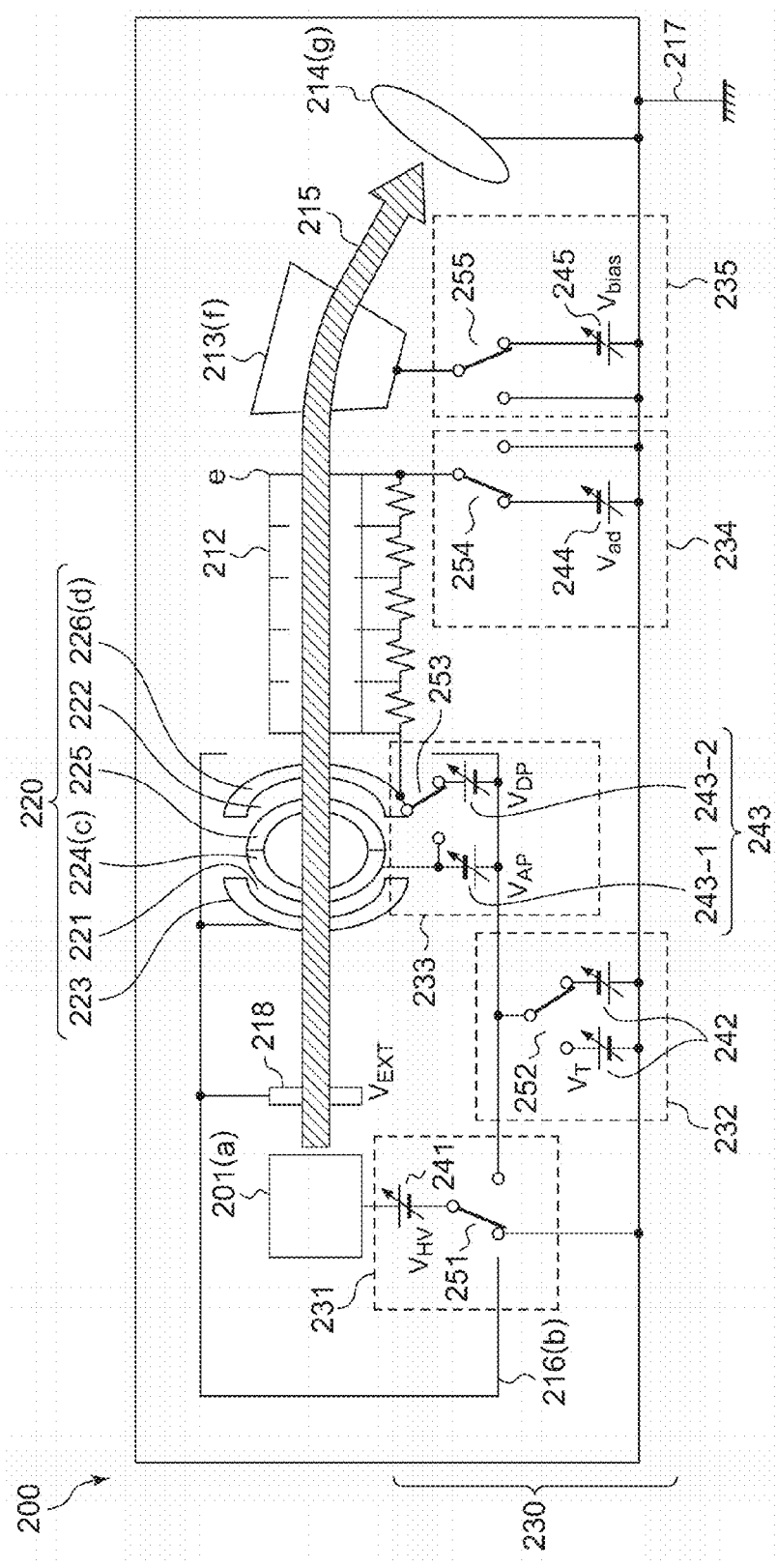
FIG. 6 is a diagram schematically illustrating a configuration of a power supply of an ion implantation apparatus according to an embodiment of the present invention.
Figure 7:
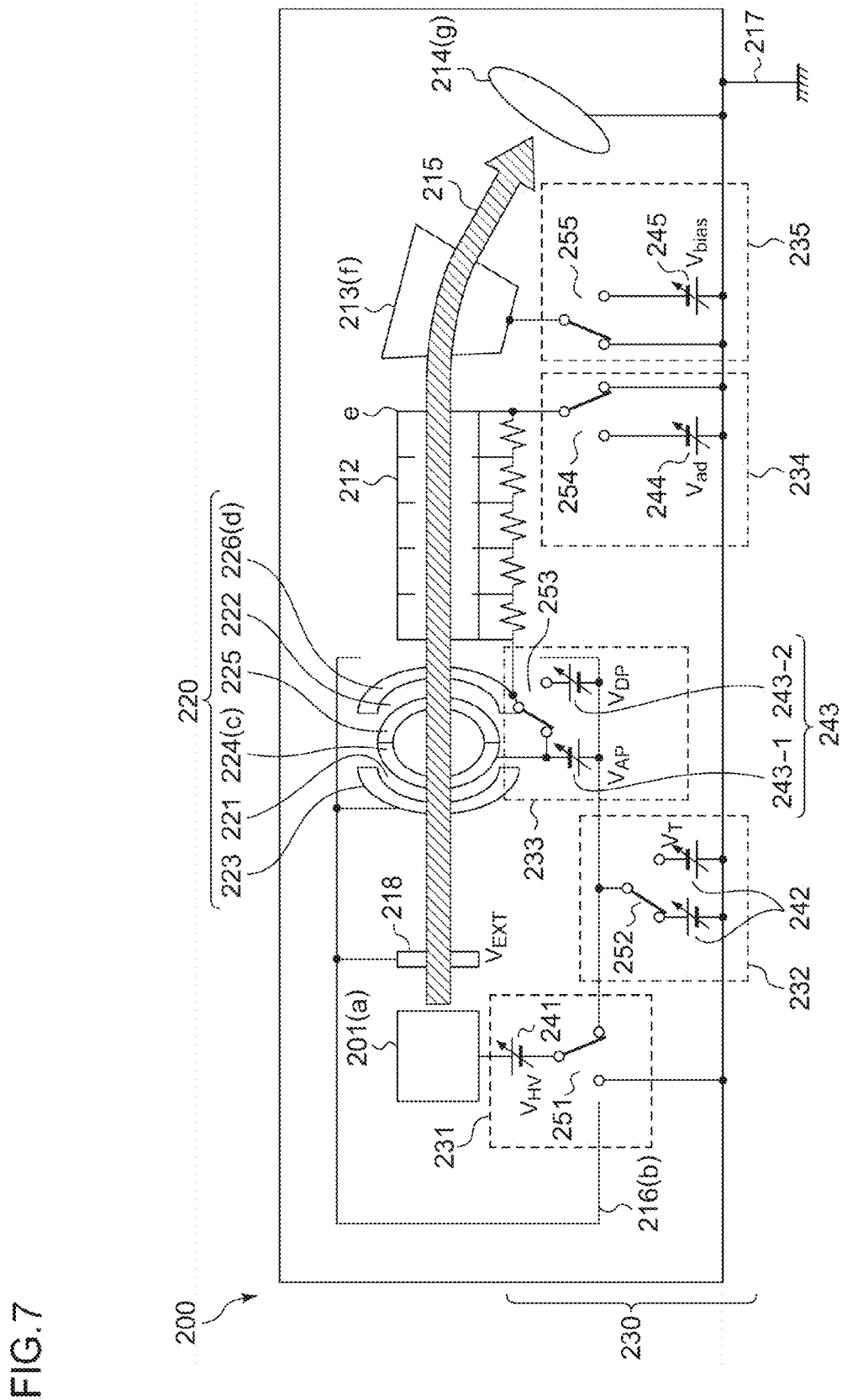
FIG. 7 is a diagram schematically illustrating a configuration of a power supply of an ion implantation apparatus according to an embodiment of the present invention.

Next, the low energy mode and the high energy mode in the ion implantation apparatus 200 illustrated in FIG. 5 will be described with reference to the configuration system diagram of the high-voltage power supply system 230 illustrated in FIGS. 6 and 7. FIG. 6 illustrates a power supply switching state of the low energy mode, and FIG. 7 illustrates a power supply switching state of the high energy mode. FIGS. 6 and 7 illustrate main components related to the energy adjustment of the ion beam among the beamline components illustrated in FIG. 5. In FIGS. 6 and 7, the ion beam 215 is indicated by an arrow.

As illustrated in FIGS. 6 and 7, the beam parallelizing mechanism 211 (see FIG. 5) includes a double P lens 220. The double P lens 220 includes a first voltage gap 221 and a second voltage gap 222 disposed spaced apart from each other along the ion movement direction. The first voltage gap 221 is disposed in the upstream, and the second voltage gap 222 is disposed in the downstream.

The first voltage gap 221 is formed between a pair of electrodes 223 and 224. The second voltage gap 222 is formed between another pair of electrodes 225 and 226 disposed in the downstream of the electrodes 223 and 224. The first voltage gap 221 and the electrodes 223 and 224 forming the gap 221 have a convex shape toward the upstream side. Conversely, the second voltage gap 222 and the electrodes 225 and 226 forming the gap 222 have a convex shape toward the downstream side. Also, for convenience of description, these electrodes may be also referred to as a first P lens upstream electrode 223, a first P lens downstream electrode 224, a second P lens upstream electrode 225, and a second P lens downstream electrode 226 below.

The double P lens 220 parallelizes the incident ion beam before emission and adjusts the energy of the ion beam by a combination of the electric fields applied to the first voltage gap 221 and the second voltage gap 222. That is, the double P lens 220 accelerates or decelerates the ion beam by the electric fields of the first voltage gap 221 and the second voltage gap 222.

Also, the ion implantation apparatus 200 includes a high-voltage power supply system 230 including a power supply for the beamline components. The high-voltage power supply system 230 includes a first power supply unit 231, a second power supply unit 232, a third power supply unit 233, a fourth power supply unit 234, and a fifth power supply unit 235. As illustrated, the high-voltage power supply system 230 includes a connection circuit for connecting the first to fifth power supply units 231 to 235 to the ion implantation apparatus 200.

The first power supply unit 231 includes a first power supply 241 and a first switch 251. The first power supply 241 is provided between the ion source 201 and the first switch 251, and is a DC power supply that provides the ion source 201 with a positive voltage. The first switch 251 connects the first power supply 241 to a ground 217 in the low energy mode (see FIG. 6), and connects the first power supply 241 to a terminal 216 in the high energy mode (see FIG. 7). Therefore, the first power supply 241 provides a voltage $V_{HV}$ to the ion source 201 in the low energy mode on the basis of a ground potential. This provides the total ion energy as it is. On the other hand, the first power supply 241 provides a voltage $V_{HV}$ to the ion source 201 in the high energy mode on the basis of a terminal potential.

The second power supply unit 232 includes a second power supply 242 and a second switch 252. The second power supply 242 is provided between the terminal 216 and the ground 217, and is a DC power supply that provides the terminal 216 with one of positive and negative voltages by the switching of the second switch 252. The second switch 252 connects a negative electrode of the second power supply 242 to the terminal 216 in the low energy mode (see FIG. 6), and connects a positive electrode of the second power supply 242 to the terminal 216 in the high energy mode (see FIG. 7). Therefore, the second power supply 242 provides a voltage $V_T$ ($V_T<0$) to the terminal 216 in the low energy mode on the basis of the ground potential. On the other hand, the second power supply 242 provides a voltage $V_T$ ($V_T>0$) to the terminal 216 in the high energy mode on the basis of the ground potential.

Therefore, an extraction voltage $V_{EXT}$ of the extraction electrode 218 is $V_{EXT}=V_{HV}-V_T$ in the low energy mode, and is $V_{EXT}=V_{HV}$ in the high energy mode. When a charge of an ion is q, the final energy is $qV_{HV}$ in the low energy mode, and is $q(V_{HV}+V_T)$ in the high energy mode.

The third power supply unit 233 includes a third power supply 243 and a third switch 253. The third power supply 243 is provided between the terminal 216 and the double P lens 220. The third power supply 243 includes a first P lens power supply 243-1 and a second P lens power supply 243-2. The first P lens power supply 243-1 is a DC power supply that provides a voltage $V_{AP}$ to the first P lens downstream electrode 224 and the second P lens upstream electrode 225 on the basis of the terminal potential. The second P lens power supply 243-2 is a DC power supply that provides a voltage $V_{DP}$ to a destination through the third switch 253 on the basis of the terminal potential. The third switch 253 is provided between the terminal 216 and the double P lens 220 to connect one of the first P lens power supply 243-1 and the second P lens power supply 243-2 to the second P lens downstream electrode 226 by the switching. Also, the first P lens upstream electrode 223 is connected to the terminal 216.

The third switch 253 connects the second P lens power supply 243-2 to the second P lens downstream electrode 226 in the low energy mode (see FIG. 6), and connects the first P lens power supply 243-1 to the second P lens downstream electrode 226 in the high energy mode (see FIG. 7). Therefore, the third power supply 243 provides a voltage $V_{DP}$ to the second P lens downstream electrode 226 in the low energy mode on the basis of the terminal potential. On the other hand, the third power supply 243 provides a voltage $V_{AP}$ to the second P lens downstream electrode 226 in the high energy mode on the basis of the terminal potential.

The fourth power supply unit 234 includes a fourth power supply 244 and a fourth switch 254. The fourth power supply 244 is provided between the fourth switch 254 and the ground 217 and is a DC power supply that provides a negative voltage to an exit (that is, the downstream end) of the AD column 212. The fourth switch 254 connects the fourth power supply 244 to the exit of the AD column 212 in the low energy mode (see FIG. 6), and connects the exit of the AD column 212 to the ground 217 in the high energy mode (see FIG. 7). Therefore, the fourth power supply 244 provides a voltage $V_{ad}$ to the exit of the AD column 212 in the low energy mode on the basis of the ground potential. On the other hand, the fourth power supply 244 is not used in the high energy mode.

The fifth power supply unit 235 includes a fifth power supply 245 and a fifth switch 255. The fifth power supply 245 is provided between the fifth switch 255 and the ground 217. The fifth power supply 245 is provided for the energy filter (AEF) 213. The fifth switch 255 is provided for switching the operation modes of the energy filter 213. The energy filter 213 is operated in a so-called offset mode in the low energy mode, and is operated in a normal mode in the high energy mode. The offset mode is an operation mode of the AEF in which an average value of the positive electrode and the negative electrode is a negative potential. The beam convergence effect of the offset mode can prevent beam loss caused by the beam divergence in the AEF. The normal mode is an operation mode of the AEF in which an average value of the positive electrode and the negative electrode is the ground potential.

The ground potential is provided to the wafer 214.

Figure 8A:
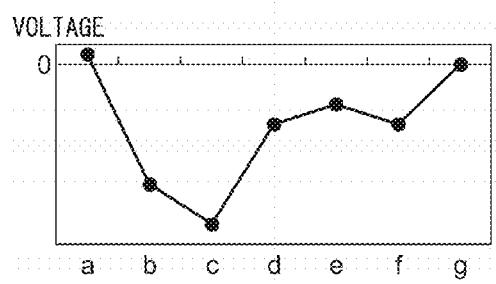
FIG. 8A is a diagram illustrating a voltage in an ion implantation apparatus according to an embodiment of the present invention.
Figure 8B:
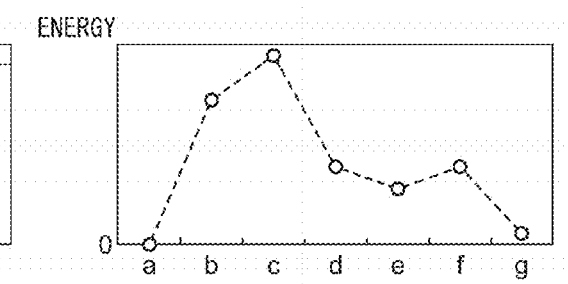
FIG. 8B is a diagram illustrating an energy in an ion implantation apparatus according to an embodiment of the present invention.
Figure 9A:
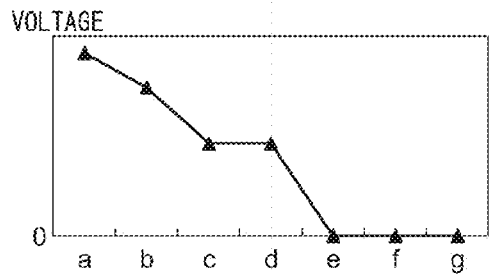
FIG. 9A is a diagram illustrating a voltage in an ion implantation apparatus according to an embodiment of the present invention.
Figure 9B:
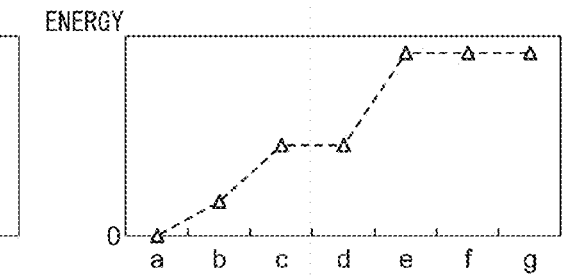
FIG. 9B is a diagram illustrating an energy in an ion implantation apparatus according to an embodiment of the present invention.

FIG. 8A illustrates an example of a voltage applied to each portion of the ion implantation apparatus 200 in the low energy mode, and FIG. 8B illustrates an example of energy of the ion in each portion of the ion implantation apparatus 200 in the low energy mode. FIG. 9A illustrates an example of a voltage applied to each portion of the ion implantation apparatus 200 in the high energy mode, and FIG. 9B illustrates an example of energy of the ion in each portion of the ion implantation apparatus 200 in the high energy mode. The vertical axes in FIGS. 8A and 9A represent the voltage, and the vertical axes in FIGS. 8B and 9B represent the energy. In the horizontal axes of the respective drawings, locations in the ion implantation apparatus 200 are represented by symbols a to g. The symbols a, b, c, d, e, f, and g represent the ion source 201, the terminal 216, the acceleration P lens (first P lens downstream electrode 224), the deceleration P lens (second P lens downstream electrode 226), the exit of the AD column 212, the energy filter 213, and the wafer 214, respectively.

The double P lens 220 has a configuration that uses the acceleration P lens c alone, or uses the deceleration P lens d alone, or uses both of the acceleration P lens c and the deceleration P lens d, when necessary according to the implantation condition. In the configuration that uses both of the acceleration P lens c and the deceleration P lens d, the double P lens 220 can be configured to change the distribution of the acceleration and deceleration effects by using both of the acceleration effect and the deceleration effect. In this case, the double P lens 220 can be configured such that a difference between the incident beam energy to the double P lens 220 and the exit beam energy from the double P lens 220 is used to accelerate or decelerate the beam. Alternatively, the double P lens 220 can be configured such that the difference between the incident beam energy and the exit beam energy becomes zero, and thus, the beam is neither accelerated nor decelerated.

As an example, as illustrated, in the low energy mode, the double P lens 220 is configured to decelerate the ion beam in the deceleration P lens d, accelerate the ion beam in the acceleration P lens c to some extent when necessary, and thereby the ion beam is decelerated as a whole. On the other hand, in the high energy mode, the double P lens 220 is configured to accelerate the ion beam only in the acceleration P lens c. Also, in the high energy mode, the double P lens 220 may be configured to decelerate the ion beam in the deceleration P lens d to some extent when necessary, as long as the ion beam is accelerated as a whole.

Since the high-voltage power supply system 230 is configured as above, the voltages applied to several regions on the beamline can be changed by the switching of the power supply. Also, the voltage application paths in some regions can also be changed. By using these, it is possible to switch the low energy mode and the high energy mode in the same beamline.

In the low energy mode, the potential $V_{HV}$ of the ion source 201 is directly applied on the basis of the ground potential. Therefore, a high-accuracy voltage application to the source unit is possible, and the accuracy of energy setting can be increased during the ion implantation at low energy. Also, by setting the terminal voltage $V_T$, the P lens voltage $V_{DP}$, the AD column exit voltage $V_{ad}$, and the energy filter voltage $V_{bias}$ to negative, it is possible to transport the ions to the energy filter at a relatively high energy. Therefore, the transport efficiency of the ion beam can be improved, and the high current can be obtained.

Also, in the low energy mode, the deceleration P lens is employed to facilitate the ion beam transport in the high energy state. This helps the low energy mode coexist with the high energy mode in the same beamline. Also, in the low energy mode, an expanded beam by design is generated by adjusting the convergence/divergence elements of the beamline in order to transport the beam such that the self-divergence of the beam is minimized. This also helps the low energy mode coexist with the high energy mode in the same beamline.

In the high energy mode, the potential of the ion source 201 is the sum of the acceleration extraction voltage $V_{HV}$ and the terminal potential $V_T$. This can enable the application of the high voltage to the source unit, and accelerate ions at high energy.

Figure 10:
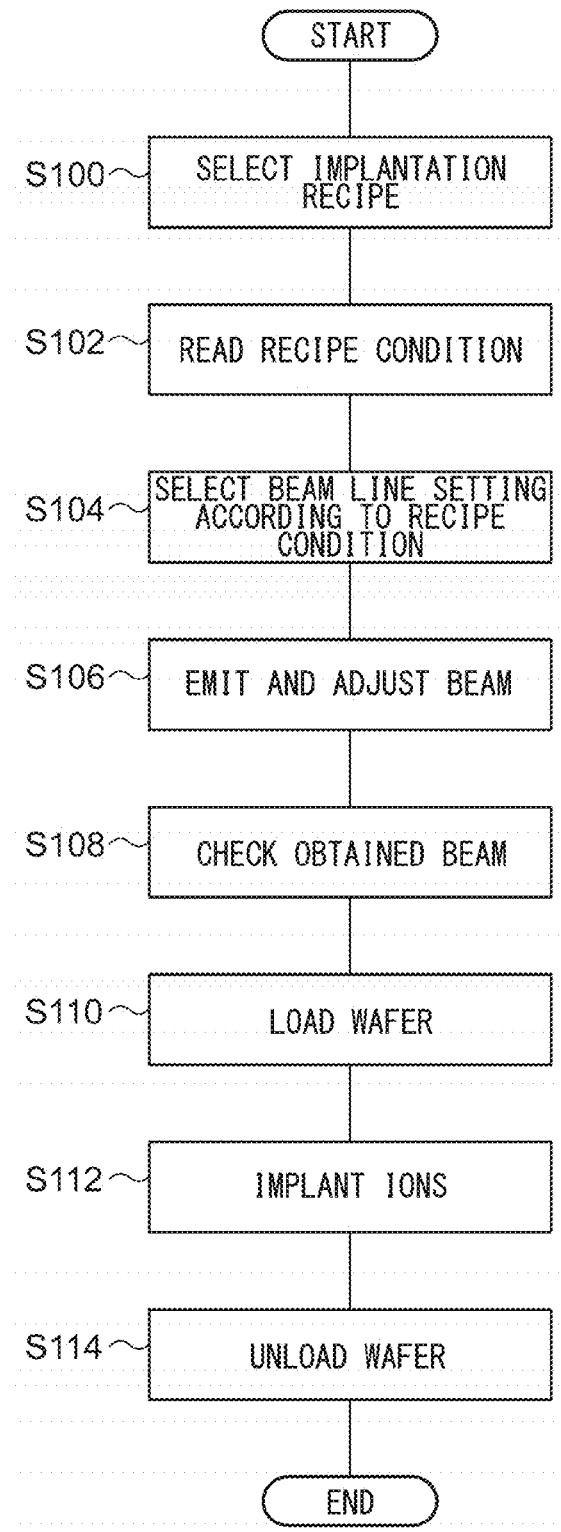
FIG. 10 is a flowchart illustrating an ion implantation method according to an embodiment of the present invention.

FIG. 10 is a flowchart illustrating an ion implantation method according to an embodiment of the present invention. This method may be performed by, for example, the beam control device for the ion implantation apparatus. As illustrated in FIG. 10, first, the implantation recipe is selected (S100). The control device reads the recipe condition (S102), and selects the beamline setting according to the recipe condition (S104). The ion beam adjusting process is performed under the selected beamline setting. The adjusting process includes a beam emission and adjustment (S106) and an obtained beam checking (S108). In this manner, the preparing process for the ion implantation is ended. Next, the wafer is loaded (S110), the ion implantation is performed (S112), and the wafer is unloaded (S114). Steps 110 to 114 may be repeated until the desired number of wafers are processed.

Figure 11:
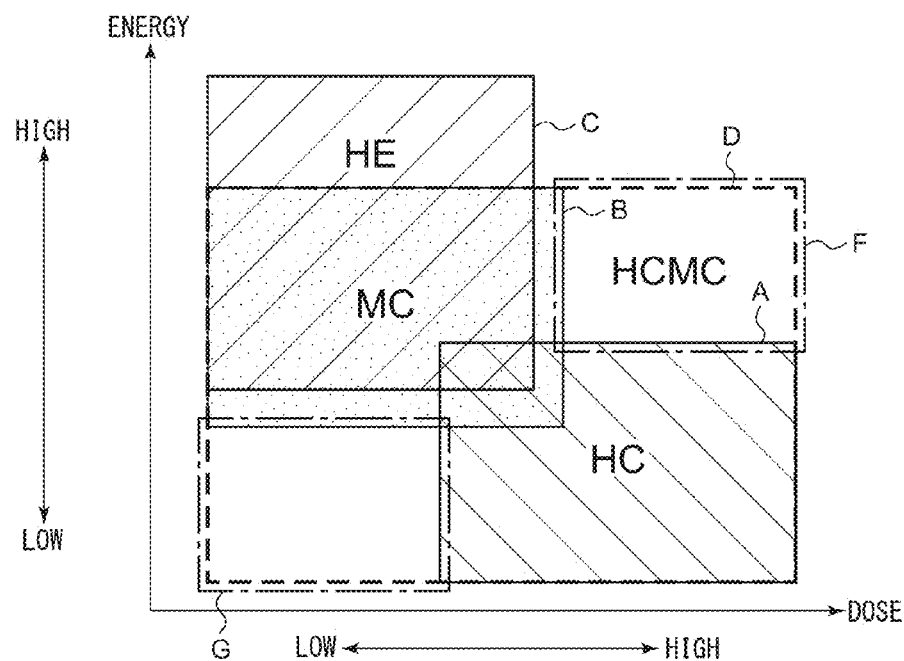
FIG. 11 is a diagram schematically illustrating ranges of an energy and a dose amount in an ion implantation apparatuses according to an embodiment of the present invention.

FIG. 11 schematically illustrates a range D of energy and dose amount that is realized by the ion implantation apparatus 200. Like in FIG. 1, FIG. 11 illustrates the range of energy and dose amount that can be processed in the actually allowable productivity. For comparison, ranges A, B and C of energy and dose amount of the HC, the MC, and the HE illustrated in FIG. 1 are illustrated in FIG. 11.

As illustrated in FIG. 11, it can be seen that the ion implantation apparatus 200 includes all the operation ranges of the existing apparatuses HC and MC. Therefore, the ion implantation apparatus 200 is a novel apparatus beyond the existing framework. Even one novel ion implantation apparatus can serve as the two existing types of categories HC and MC while maintaining the same beamline and the implantation method. Therefore, this apparatus may be referred to as HCMC.

Therefore, according to the present embodiment, it is possible to provide the HCMC in which the serial-type high-dose high-current ion implantation apparatus and the serial-type medium-dose medium-current ion implantation apparatus are configured as a single apparatus. The HCMC can perform the implantation in a broad range of energy condition and dose condition by changing the voltage applying method in the low energy condition and the high energy condition and changing the beam current from high current to low current in the CVA.

Figure 12:
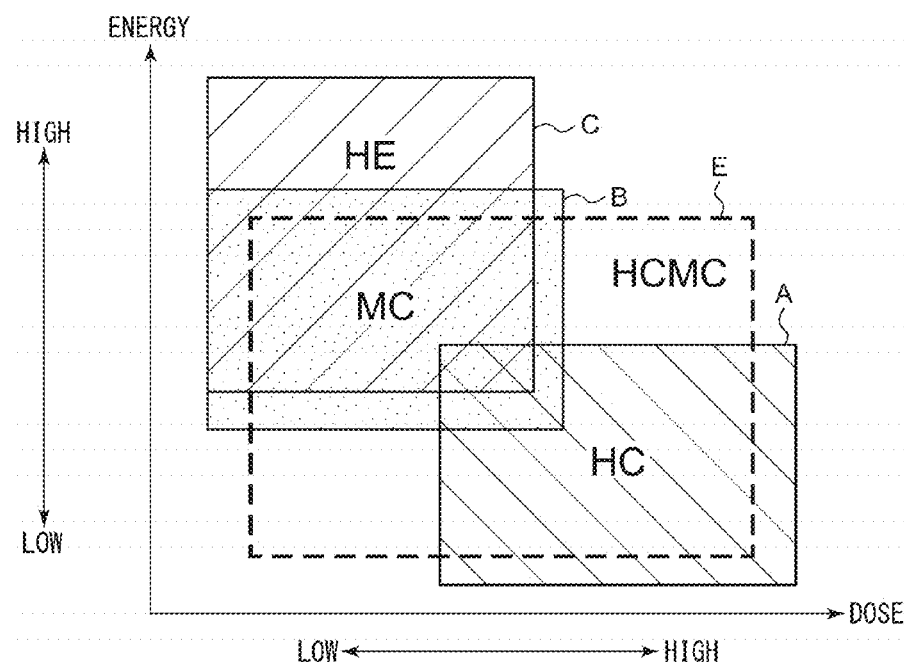
FIG. 12 is a diagram schematically illustrating ranges of an energy and a dose amount in an ion implantation apparatuses according to an embodiment of the present invention.

Also, the HCMC-type ion implantation apparatus may not include all the implantation condition ranges of the existing HC and MC. Considering the tradeoff of the device manufacturing cost and the implantation performance, it may be thought to provide an apparatus having a range E (see FIG. 12) narrower than the range D illustrated in FIG. 11. In this case, the ion implantation apparatus having excellent practicality can be provided as long as it covers the ion implantation conditions required for the device maker.

Figure 13:
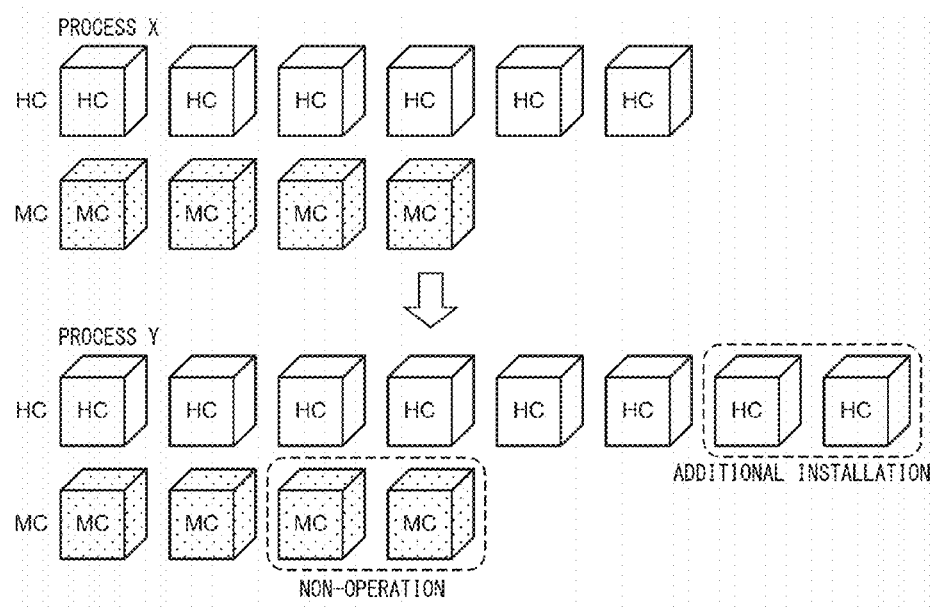
FIG. 13 is a diagram describing the use of a typical ion implantation apparatus.

The improvement in the operation efficiency of the apparatus realized by the HCMC in the device manufacturing process will be described. For example, as illustrated in FIG. 13, it is assumed that a device maker uses six HCs and four MCs in order to process a manufacturing process X (that is, this device maker owns only the existing apparatuses HC and MC). Thereafter, the device maker changes the process X to a process Y according to a change in a manufacturing device. As a result, the device maker needs eight HCs and two MCs. The maker needs to install two more HCs, and thus, the increase in investment and the lead time are required. At the same time, two MCs are not operated, and thus, the maker unnecessarily owns these. As described above, since the HC and the MC are generally different in the implantation method, it is difficult to convert the non-operating MCs to newly necessary HCs.

Figure 14:
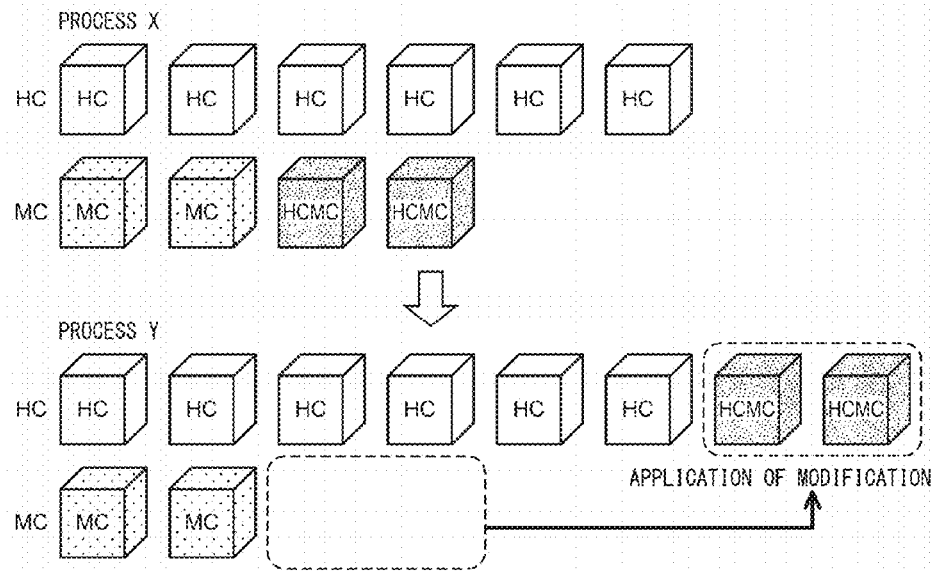
FIG. 14 is a diagram describing the use of an ion implantation apparatus according to an embodiment of the present invention.

Next, as illustrated in FIG. 14, it is considered that the device maker uses six HCs, two MCs, and two HCMCs in order to process the process X. In this case, even when the process X is changed to the process Y according to the change in the manufacturing device, the HCMC can be operated as the HC because the HCMC is the process shared machine of the HC and the MC. Therefore, additional equipment installation and non-operation are unnecessary.

As such, there is a great merit when the device maker owns a certain number of HCMCs. This is because the process change of HC and the MC can be absorbed by the HCMC. Also, when some apparatuses cannot be used due to malfunction or maintenance, the HCMC can also be used as the HC or the MC. Therefore, by owning the HCMC, the overall operating rate of the apparatus can be significantly improved.

Also, ultimately, it can be considered that all apparatuses are provided with HCMCs. However, in many cases, it is practical that part of the apparatuses are provided with HCMCs considering a price difference between the HCMC and the HC (or MC) or the utilization of the already owned HC or MC.

Also, when a type of the existing ion implantation apparatus is replaced with other apparatuses having different methods of implanting ions into the wafer in order for an ion implantation process to be performed, it may be difficult to match the implantation characteristics. This is because a beam divergence angle or a beam density may be different even though the energy and dose are matched in two types of ion implantation apparatuses for the ion implantation process. However, the HCMC can process the high-dose high-current ion implantation condition and the medium-dose medium-current ion implantation condition on the same beamline (the same ion beam trajectory). In this way the HCMC can separately use the high-dose high-current ion implantation condition and the medium-dose medium-current ion implantation condition. Therefore, it is expected to facilitate the matching because the change in the implantation characteristics followed by the replacement of the apparatus is sufficiently suppressed.

The HCMC is the shared machine of the HC and the MC and can also process the implantation condition out of the operation range of the existing HC or the MC. As illustrated in FIG. 11, the HCMC is a new apparatus that can also process the high energy/high dose implantation (right upper region F in the range D) and low energy/low dose implantation (left lower region G in the range D). Therefore, in addition or alternative to the first beamline setting S1 and the second beamline setting S2 described above, in an embodiment, the ion implantation apparatus may include a third beamline setting for high energy/high dose implantation and/or a fourth beamline setting for low energy/low dose implantation.

As described above, in the present embodiment, the beamlines of the serial-type high-dose high-current ion implantation apparatus and the serial-type medium-dose medium-current ion implantation apparatus are matched and shared. Moreover, a structure for switching the beamline configuration is constructed. In this manner, the implantation processing is possible over a broad range of energy and beam current regions on the same beamline (the same ion beam trajectory and the same implantation method).

The present invention has been described based on the embodiments. The present invention is not limited to the embodiments, and it can be understood by those skilled in the art that designs can be modified in various ways, various modifications can be made, and such modifications fall within the scope of the present invention.

In addition or alternative to the above-described configurations, the quantitative adjustment of the beam current by the beam current adjustment system can be configured in various ways. For example, when the beam current adjustment system includes a variable-width aperture arranged on the beamline, the variable-width aperture may be disposed at any arbitrary position. Therefore, the variable-width aperture may be disposed between the ion source and the mass analysis magnet, between the mass analysis magnet and the mass analysis slit, between the mass analysis slit and the beam shaping device, between the beam shaping device and the beam control device, between the beam control device and the beam conditioning device, between the respective elements of the beam conditioning device, and/or between the beam conditioning device and the workpiece. The variable-width aperture may be the mass analysis slit.

The beam current adjustment may be configured to adjust the amount of ion beam passing through the aperture by arranging the divergence/convergence lens system before and/or after a fixed-width aperture. The fixed-width aperture may be the mass analysis slit.

The beam current adjustment may be performed using an energy slit opening width variable (and/or a beamline end opening width variable slit apparatus). The beam current adjustment may be performed using an analyzer magnet (mass analysis magnet) and/or a steerer magnet (trajectory modification magnet). The dose amount adjustment may be accompanied by an expansion of the variable range of mechanical scan speed (for example, from ultra-low speed to ultra-high speed) and/or a change in the number of times of the mechanical scanning.

The beam current adjustment may be performed by the adjustment of the ion source (for example, amount of gas or arc current). The beam current adjustment may be performed by the exchange of the ion source. In this case, the ions source for MC and the ion source for HC may be selectively used. The beam current adjustment may be performed by the gap adjustment of the extraction electrode of the ion source. The beam current adjustment may be performed by providing the CVA immediately downstream of the ion source.

The beam current adjustment may be performed according to the change in the vertical width of the ribbon beam. The dose amount adjustment may be performed according to the change in the scanning speed during the two-dimensional mechanical scanning.

The beamline device may include a plurality of beamline components configured to operate under only one of the first beamline setting and the second beamline setting, and thus, the ion implantation apparatus may be configured as a high-current ion implantation apparatus or a medium-current ion implantation apparatus. That is, with the HCMC as a platform, for example, by exchanging some beamline components, or changing the power supply configuration, the serial-type high-dose dedicated ion implantation apparatus or the serial-type medium-dose dedicated ion implantation apparatus can be produced from the serial-type high-dose medium-dose wide-use ion implantation apparatus. Since it is expected to manufacture each dedicated apparatus at lower cost than the wide-use apparatus, it can contribute to reducing the manufacturing costs for the device maker.

In the MC, implantation at higher energy may be achieved by using multivalent ions such as divalent ions or trivalent ions. However, in the typical ion source (thermionic emission type ion source), the generation efficiency of multivalent ions is much lower than the generation efficiency of monovalent ions. Therefore, practical dose implantation in the high energy range is actually difficult. When a multivalent ion enhancement source, such as an RF ion source, is employed as the ion source, tetravalent or pentavalent ions can be obtained. Therefore, more ion beams can be obtained in the higher energy condition.

Therefore, by employing the multivalent ion enhancement source, such as the RF ion source, as the ion source, the HCMC can operate as the serial-type high energy ion implantation apparatus (HE). Therefore, a portion of the implantation condition that has been processed by only the serial-type high energy/low-dose ion implantation apparatus can be processed by the HCMC (the range of the MC illustrated in FIG. 8 may be expanded to include at least a portion of the range C).

Hereinafter, several aspects of the present invention will be described.

An ion implantation apparatus according to an embodiment includes: an ion source for generating ions and extracting the ions as an ion beam; an implantation processing chamber for implanting the ions into a workpiece; and a beamline device for providing a beamline to transport the ion beam from the ion source to the implantation processing chamber, wherein the beamline device supplies the ion beam having a beam irradiation region exceeding the width of the workpiece in the implantation processing chamber, the implantation processing chamber includes a mechanical scanning device for mechanically scanning the workpiece with respect to the beam irradiation region, the beamline device is operated under one of a plurality of implantation setting configurations according to an implantation condition, the plurality of implantation setting configurations including a first implantation setting configuration suitable for transport of a low energy/high current beam for high-dose implantation into the workpiece, and a second implantation setting configuration suitable for transport of a high energy/low current beam for low-dose implantation into the workpiece, and the beamline device is configured such that a same beam center trajectory being a reference in the beamline is provided from the ion source to the implantation processing chamber in the first implantation setting configuration and the second implantation setting configuration.

An ion implantation apparatus according to an embodiment includes: an ion source for generating ions and extracting the ions as an ion beam; an implantation processing chamber for implanting the ions into a workpiece; and a beamline device for providing a beamline to transport the ion beam from the ion source to the implantation processing chamber, wherein the ion implantation apparatus is configured to irradiate the workpiece with the ion beam in cooperation with mechanical scanning of the workpiece, the beamline device is operated under one of a plurality of implantation setting configurations according to an implantation condition, the plurality of implantation setting configurations including a first implantation setting configuration suitable for transport of a low energy/high current beam for high-dose implantation into the workpiece, and a second implantation setting configuration suitable for transport of a high energy/low current beam for low-dose implantation into the workpiece, and the beamline device is configured such that a same beam center trajectory being a reference in the beamline is provided from the ion source to the implantation processing chamber in the first implantation setting configuration and the second implantation setting configuration.

The beamline device may take the same implantation method in the first implantation setting configuration and the second implantation setting configuration. The beam irradiation region may be equal in the first implantation setting configuration and the second implantation setting configuration.

The beamline apparatus may include a beam conditioning device for conditioning the ion beam, and a beam shaping device for shaping the ion beam. The beam conditioning device and the beam shaping device in the beamline device may be disposed in the same layout in the first implantation setting configuration and the second implantation setting configuration. The beam implantation apparatus may have the same installation floor area in the first implantation setting configuration and the second implantation setting configuration.

The beamline device may include a beam current adjustment system for adjusting the total amount of beam current of the ion beam. The first implantation setting configuration may include a first beam current setting for the beam current adjustment system, the second implantation setting configuration may include a second beam current setting for the beam current adjustment system, and the second beam current setting may be determined to make the beam current of the ion beam smaller than that of the first beam current setting.

The beam current adjustment system may be configured to block at least a portion of the ion beam when passing through an adjustment element. The beam current adjustment system may include a variable-width aperture arranged on the beamline. The beam current adjustment system may include a beamline end opening width variable slit device. The ion source may be configured to adjust the total amount of beam current of the ion beam. The ion source may include an extraction electrode for extracting the ion beam, and the total amount of beam current of the ion beam may be adjusted by adjusting an opening of the extraction electrode.

The beamline device may include an energy adjustment system for adjusting an implantation energy of the ions into the workpiece. The first implantation setting configuration may include a first energy setting for the energy adjustment system, the second implantation setting configuration may include a second energy setting for the energy adjustment system, the first energy setting may be suitable for transport of a lower energy beam as compared with the second energy setting.

The energy adjustment system may include a beam parallelizing device for parallelizing the ion beam. The beam parallelizing device may be configured to decelerate, or decelerate and accelerate the ion beam under the first implantation setting configuration, and accelerate, or accelerate and decelerate the ion beam under the second implantation setting configuration. The beam parallelizing device may include an acceleration lens for accelerating the ion beam, and a deceleration lens for decelerating the ion beam, and may be configured to modify a distribution of acceleration and deceleration, and the beam parallelizing device may be configured to mainly decelerate the ion beam under the first implantation setting configuration, and mainly accelerate the ion beam under the second implantation setting configuration.

The beamline device may include a beam current adjustment system for adjusting the total amount of beam current of the ion beam, and an energy adjustment system for adjusting an implantation energy of the ions into the workpiece, and may adjust the total amount of the beam current and the implantation energy individually or simultaneously. The beam current adjustment system and the energy adjustment system may be separate beamline components.

The ion implantation apparatus may include a control unit configured to manually or automatically select one implantation setting configuration suitable for a given ion implantation condition among the plurality of implantation setting configurations including the first implantation setting configuration and the second implantation setting configuration.

The control unit may select the first implantation setting configuration when a desired ion dose amount implanted into the workpiece is in the range of about $1\times10^{14}$ to $1\times10^{17}$ atoms/cm$^2$, and may select the second implantation setting configuration when a desired ion dose amount implanted into the workpiece is in the range of about $1\times10^{11}$ to $1\times10^{14}$ atoms/cm$^2$.

The beamline device may have a first energy adjustment range under the first implantation setting configuration, and may have a second energy adjustment range under the second implantation setting configuration, and the first energy adjustment range and the second energy adjustment range may have a partially overlapped range.

The beamline device may have a first dose adjustment range under the first implantation setting configuration, and may have a second dose adjustment range under the second implantation setting configuration, and the first dose adjustment range and the second dose adjustment range may have a partially overlapped range.

The beamline device may include a beam scanning device for providing scanning of the ion beam to form an elongated irradiation region extending in a longitudinal direction perpendicular to a beam transportation direction. The implantation processing chamber may include a workpiece holder configured to provide mechanical scanning of the workpiece in a direction perpendicular to the longitudinal direction and the beam transportation direction.

The beamline device may include a ribbon beam generator for generating a ribbon beam having an elongated irradiation region extending in a longitudinal direction perpendicular to a beam transportation direction. The implantation processing chamber may include a workpiece holder configured to provide mechanical scanning of the workpiece in a direction perpendicular to the longitudinal direction and the beam transportation direction.

The implantation processing chamber may include a workpiece holder configured to provide mechanical scanning of the workpiece in two directions perpendicular to each other in a plane perpendicular to the beam transportation direction.

The beamline device may be configured to be selectable from a plurality of beamline components configured to be operated under only one of the first implantation setting configuration and the second implantation setting configuration, and the ion implantation apparatus may be configured as a high-current dedicated ion implantation apparatus or a medium-current dedicated ion implantation apparatus.

An ion implantation method according to an embodiment includes: selecting one implantation setting configuration, with respect to a beamline device, which is suitable for a given ion implantation condition among a plurality of implantation setting configurations including a first implantation setting configuration suitable for transport of a low energy/high current beam for high-dose implantation into a workpiece, and a second implantation setting configuration suitable for transport of a high energy/low current beam for low-dose implantation into the workpiece; transporting an ion beam along a beam center trajectory being a reference in a beamline from an ion source to an implantation processing chamber by using the beamline device under the selected implantation setting configuration; and irradiating the workpiece with the ion beam in cooperation with mechanical scanning of the workpiece, wherein the beam center trajectory being the reference is equal in the first implantation setting configuration and the second implantation setting configuration.

The transporting may include adjusting an implantation dose amount into the workpiece by adjusting the total amount of beam current of the ion beam. The implantation dose amount may be adjusted in a first dose adjustment range under the first implantation setting configuration, and may be adjusted in a second dose adjustment range under the second implantation setting configuration, the second dose adjustment range including a dose range smaller than the first dose adjustment range.

The transporting may include adjusting the implantation energy into the workpiece. The implantation energy may be adjusted in a first energy adjustment range under the first implantation setting configuration, and may be adjusted in a second energy adjustment range under the second implantation setting configuration, the second energy adjustment range including an energy range higher than the first energy adjustment range.

1. An ion implantation apparatus according to an embodiment has the same beam trajectory and the same implantation method and has a broad energy range by switching a connection of a power supply for deceleration as a whole and a connection of a power supply for acceleration as a whole.

2. An ion implantation apparatus according to an embodiment has the same beam trajectory and the same implantation method and has a broad beam current range by including a device for cutting a portion of beam in a beamline upstream part in a beamline capable of obtaining a high current.

3. An ion implantation apparatus according to an embodiment may have the same beam trajectory and the same implantation method and have a broad energy range and a broad beam current range by including both of the features of the embodiment 1 and the embodiment 2.

An ion implantation apparatus according to an embodiment may be an apparatus that combines a beam scanning and a mechanical wafer scanning as the same implantation method in the embodiments 1 to 3. An ion implantation apparatus according to an embodiment may be an apparatus that combines a ribbon-shaped beam and a mechanical wafer scanning as the same implantation method in the embodiments 1 to 3. An ion implantation apparatus according to an embodiment may be an apparatus that combines a two-dimensional mechanical wafer scanning as the same implantation method in the embodiments 1 to 3.

4. An ion implantation apparatus according to an embodiment is configured to freely select/switch a high-dose high-current ion implantation and a medium-dose medium-current ion implantation by configuring a high-dose high-current ion implantation beamline component and a medium-dose medium-current ion implantation beamline component in parallel on the same beamline (the same ion beam trajectory and the same implantation method), and covers a very broad energy range from low energy to high energy and a very broad dose range from a low dose to a high dose.

5. In the embodiment 4, each beamline component shared in the high dose use and the medium dose use and each beamline component individually switched in the high dose/medium dose use may be configured on the same beamline.

6. In the embodiment 4 or 5, in order to adjust the beam current amount in a broad range, a beam limiting device (vertical or horizontal variable-width slit, or rectangular or circular variable opening) for physically cutting a portion of beam in a beamline upstream part may be provided.

7. In any one of the embodiments 4 to 6, a switch controller control device may be provided to select a high-dose high-current ion implantation and a medium-dose medium-current ion implantation, based on a desired ion dose amount implanted into the workpiece.

8. In the embodiment 7, the switch controller is configured to operate the beamline in a medium-dose acceleration (extraction)/acceleration (P lens)/acceleration or deceleration (AD column) mode when a desired ion dose amount implanted into the workpiece is in the medium-dose medium-current range of about $1 \times 10^{11}$ to $1 \times 10^{14}$ atoms/cm$^2$, and operate the beamline in a high-dose acceleration (extraction)/deceleration (P lens)/deceleration (AD column) mode when a desired ion dose amount implanted into the workpiece is in the high-dose high-current range of about $1 \times 10^{14}$ to $1 \times 10^{17}$ atoms/cm$^2$.

9. In any one of the embodiments 4 to 8, an apparatus for implanting ions of relatively high energy by using an acceleration mode and an apparatus for implanting ions of relatively low energy by using a deceleration mode may have a mutually overlapped energy range.

10. In any one of the embodiments 4 to 8, an apparatus for implanting ions of relatively high energy by using an acceleration mode and an apparatus for implanting ions of relatively low energy by using a deceleration mode may have a mutually overlapped dose range.

11. In any one of the embodiments 4 to 6, by limiting the beamline components, the ion implantation apparatus may easily be changed to a high-dose high-current dedicated ion implantation apparatus or a medium-dose medium-current dedicated ion implantation apparatus.

12. In any one of the embodiments 4 to 11, the beamline configuration may combine a beam scanning and a mechanical substrate scanning.

13. In any one of the embodiments 4 to 11, the beamline configuration may combine a mechanical substrate scanning and a ribbon-shaped beam having a width equal to or greater than a width of a substrate (or wafer or workpiece).

14. In any one of the embodiments 4 to 11, the beamline configuration may include a mechanical substrate scanning in a two-dimensional direction.

The description has been so far given of the ion implantation apparatus and the ion implantation method capable of providing the ion beam having a desired beam current and/or a desired ion energy selected from a wide range. At the same time, in the latest advanced ion implantation, it is desired that not only these basic characteristics but also other characteristics, such as density distribution (or beam profile) and/or angular spread of ion beam be controlled.

In order to quantify the angular spread of ion beam, the angular distribution of ion beam, i.e., an angular distribution of ion traveling direction, is used. Typical indices indicating the angular distribution of ion beam are the "beam parallelism" and the "beam divergence". Though described later in detail, the beam parallelism relates to the centroid of the angular distribution, whereas the beam divergence relates to the breadth of the angular distribution.

There is a case where desired is an ion beam whose beam divergence is small (close to zero). On the other hand, as the ion beam is transported downstream toward a workpiece, the ion beam tends to spread and therefore the beam divergence tends to increase. This is because of a beam divergence effect caused by the repulsive forces among ions (namely, a divergence phenomenon caused by the beam potential), which is the so-called space charge effect that acts between the ions.

There is another case where desired is an ion beam having a certain amplitude of beam divergence. In this case, a certain degree of breadth may be purposely given to the angular distribution of ion beam. This can reduce an adverse effect from the variation or the error in the implantation angle of ion beam relative to the workpiece and thereby can enhance the robustness of ion implantation condition.

In the light of this, an embodiment of the present invention provides an ion implantation apparatus and an ion implantation method capable of controlling the beam divergence. Though described later in detail, in an embodiment the beam divergence is controlled by adjusting the focal position of ion beam. For example, the focal position of an incident ion beam into the beam scanning unit is moved, on a central axis of the incident ion beam, to a position, which is different from a scan origin of the beam scanning unit, thereby controlling the beam divergence of the ion beam implanted into the workpiece. Setting appropriately the focal position of the incident ion beam into the beam scanning unit allows the beam divergence of the ion beam implanted into a surface of the workpiece to be controlled at a desired value.

Figure 15A:
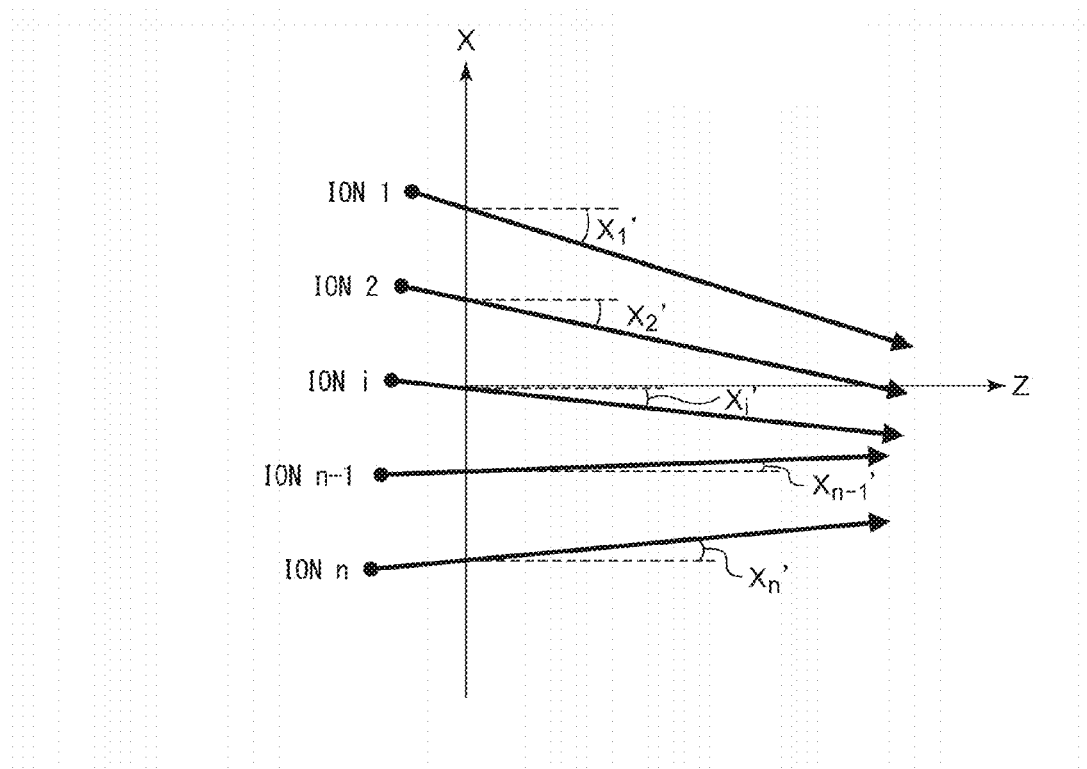
FIG. 15A shows an exemplary traveling direction of individual ions in an ion beam.
Figure 15B:
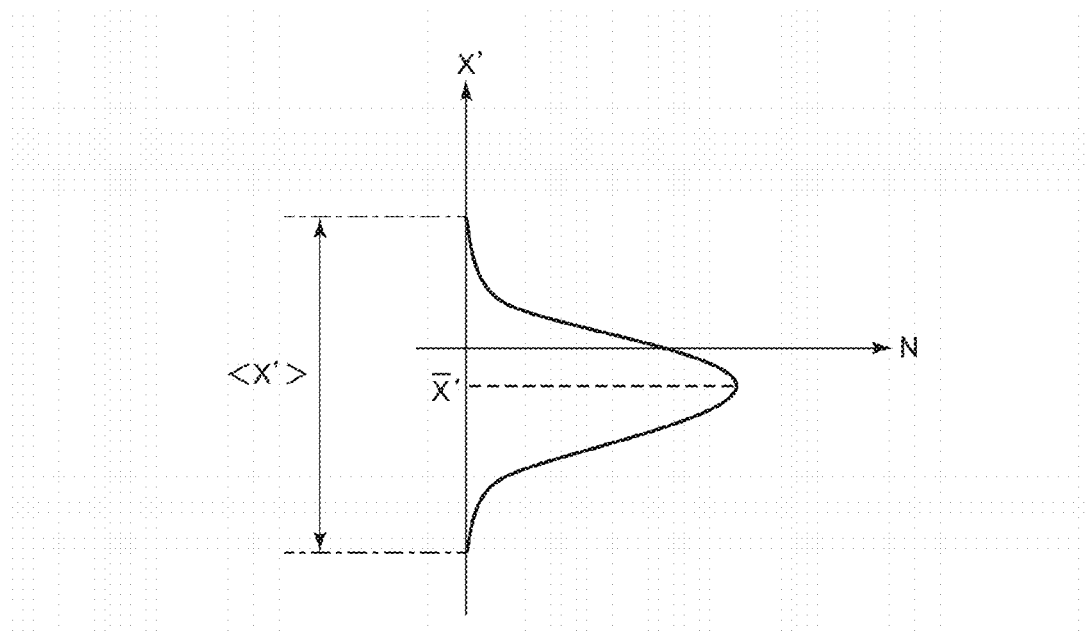
FIG. 15B shows an exemplary angular distribution of ion beam.

FIG. 15A shows exemplary traveling directions of individual ions in an ion beam. FIG. 15B shows an exemplary angular distribution of an ion beam. In FIG. 15A, a designed traveling direction of ion beam is denoted by a "Z" direction, and a direction perpendicular to the Z direction is denoted by an "X" direction. A Z axis corresponds to the designed central trajectory of the ion beam. Thus, the Z axis is the central axis of an ion beam entering the beam scanning unit. The X direction may be a horizontal direction, for example, which may be a beam scanning direction.

An ion beam is formed by a large number of ions, and each of these ions has roughly a velocity approximately parallel to the Z direction. However, as a matter of fact, the velocities of all ions are not exactly parallel to the Z direction. In other words, the traveling direction of each ion forms a certain amount of angle with respect to the Z direction. An X-direction component of this angle formed between the traveling direction and the Z direction is denoted by "X'" in this patent specification. As illustrated in FIG. 15A, the X-direction component of velocity of an i-th ion (i=1, 2, . . . , n) at a given Z-direction position is directed in a direction of angle Xi' relative to the Z direction.

The traveling directions of most ions are approximately parallel to the Z direction, and only a part of ions form relatively large angles with the Z direction. Thus, when the number N of ions having the angle X' in the traveling direction is exemplarily illustrated, a mountain-shaped distribution is drawn, as shown in FIG. 15b, where the maximum value is attained at the center. In order to actually acquire such an angular distribution, the beam current is measured and the measured beam current is regarded as the number N of ions.

The "beam parallelism" of an ion beam indicates an angle formed between the centroid of angular distribution of the ion beam and a designed central trajectory of the ion beam as a group or cluster composed of a large number of ions. The beam parallelism is calculated by using the following Equation (1). In the angular distribution shown in FIG. 15B, $\overline{X'}$, which is the median value of distribution, corresponds to the beam parallelism. Here, I(x') means the measured beam current which has the angle x'.

$$\overline{X'} = \frac{\sum_{i=1}^{n} X_i'}{n} = \frac{\int_{X'} I(X')dX'}{\int_{X'} I(X')} \quad \text{Eq. (1)}$$

The "beam divergence" of an ion beam indicates both a "breadth or extent of spread" of angular distribution of ion beam and a "state of beam convergence/divergence" as a group or cluster composed of a large number of ions. The beam divergence may be calculated by using the following Equation (2), for instance. In the angular distribution shown in FIG. 15B, <X'>, which is the breadth of the angular distribution, corresponds to the beam divergence.

$$<X'> = (-1)^k \cdot |\max(X_i') - \min(X_i')| \quad \text{Eq. (2)}$$

k=0: divergence,
k=1: convergence

When the beam divergence is a positive value (k=0), this indicates that the ion beam is a divergent (diverging) beam. When, on the other hand, the beam divergence is a negative value (k=1), this indicates that the ion beam is a convergent (converging) beam. For example, the ion beam exemplified in FIG. 15A is a convergent beam, and the beam divergence of the ion beam becomes a negative value when it is calculated by using the above Equation (2).

When the beam divergence is zero, this indicates that all ions in an ion beam is in an ideal state where all the ions have the identical traveling direction. When the beam divergence (more precisely, the absolute value thereof) is a small value, this indicates that the deviation in the traveling directions of the respective ions is small. When, on the other hand, the beam divergence is a large value, this indicates that the deviation in the traveling directions of the respective ions is large.

Although both the "beam parallelism" and the "beam divergence" are quantities that indicate the angular information on an ion beam, their meanings differ from each other. Thus, even though a certain ion beam and another ion beam are equal in terms of the beam parallelism, it is not necessarily true in general that the beam divergences of these two ion beams are equal; on the contrary, in such a case, these two ion beams usually have different beam divergences.

Figure 16:
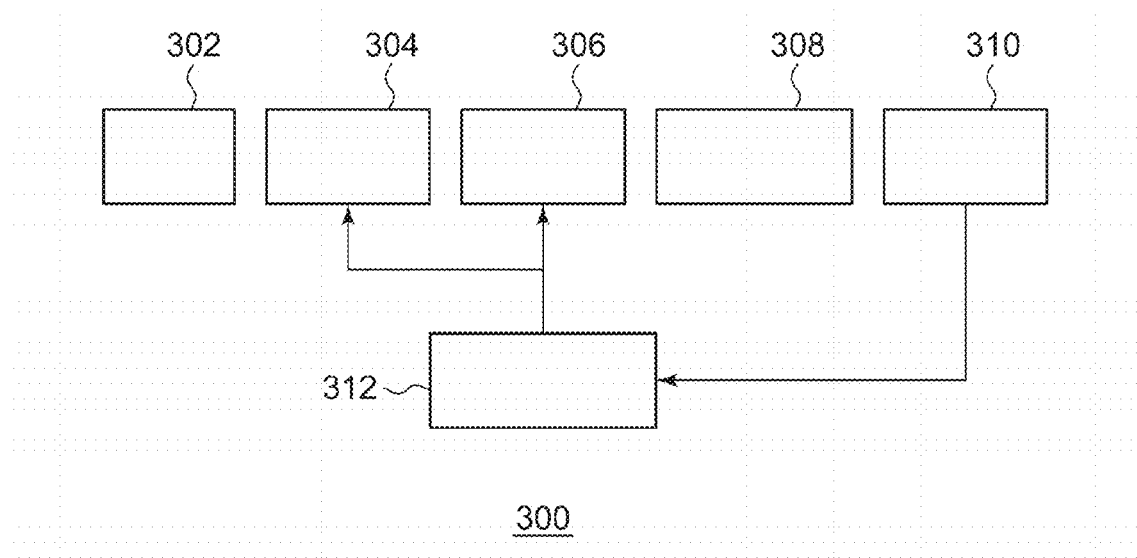
FIG. 16 schematically shows a structure of an ion implantation apparatus according to an embodiment of the present invention.

FIG. 16 schematically shows a structure of an ion implantation apparatus 300 according to an embodiment of the present invention. The ion implantation apparatus 300 includes an ion source 302, a beam focusing unit 304, a beam scanning unit 306, a beam parallelizing unit 308, and a beam divergence measurement unit 310 in this order from the upstream of the beamline. Thus, the beam focusing unit 304 is arranged upstream of the beam scanning unit 306, and the beam parallelizing unit 308 is arranged downstream of the beam scanning unit 306. The beam divergence measurement unit 310 is arranged downstream of the beam parallelizing unit 308.

The beam scanning unit 306 is a beam scanner used to scan an ion beam and may be the scanner 209 (e.g., see FIG. 5A), for instance. The beam scanning unit 306 is configured to scan the ion beam at a certain frequency within a fixed angular range by deflecting the beam relative to the aforementioned beam central trajectory from one end to the other end, and vice versa, of the fixed range. The beam scanning unit 306 is so designed as to have the scan origin on the central axis of an incident ion beam. The scan origin of the beam scanning unit 306 is located in a central part of the beam scanning unit 306.

The beam parallelizing unit 308 is a beam parallelizing device used for parallelization of the scanned beam, and may be the beam parallelizing mechanism 211 (e.g., see FIG. 5A)

or the P lens 220 (e.g., see FIG. 6), for instance. The beam parallelizing unit 308 may be an electrostatic beam parallelizing device or a magnetic beam parallelizing device.

The beam parallelizing unit 308 is designed such that a focal point of a parallelizing lens, is located at the scan origin of the beam scanning unit 306. In principle, the beam parallelizing unit 308 is configured such that the beams radiated from the focal point are parallelized. For this reason, all ion beams, which are deflected at the scan origin within a scanning angular range and then enter the beam parallelizing unit 308, are parallelized by the beam parallelizing unit 308.

The ion implantation apparatus 300 is configured such that the parallelized ion beams are implanted into a wafer (substrate). Beam conditioning devices such as an acceleration/deceleration device (e.g., the AD column 212) for varying the energy and an energy analysis device (e.g., the energy filter 213), as shown in FIG. 5A, may be provided, as necessary, in between the beam parallelizing unit 308 and the wafer.

The beam focusing unit 304 is a beam focusing device capable of controlling the focal position of an ion beam entering the beam scanning unit 306 at least in a central axis direction of this ion beam. The beam focusing unit 304 is configured such that the beam focusing unit 304 exerts a focusing/defocusing action on the ion beam entering the beam scanning unit 306, at least in the same direction as the beam scanning direction. The beam focusing unit 304 is configured such that the focal position of the incident ion beam into the beam scanning unit 306 is located upstream of the scan origin along the central axis of the incident ion beam. Instead, the beam focusing unit 304 may be configured such that this focal position is located downstream of the scan origin; in this case, the focal position is located downstream of the scan origin along the central axis of an ion beam, when the ion beam exits from the beam scanning unit 306 in a non-scanning condition.

The beam focusing unit 304 may be, for example, the first XY focusing lens 206 (e.g., a Q lens) or the second XY focusing lens 208 (e.g., an XY-direction einzel lens) (e.g., see FIG. 5A). Where the beam focusing unit 304 is provided with a Q lens, the Q lens may be a single Q lens, a doublet Q lens or a triplet Q lens. Where the beam focusing unit 304 is provided with the einzel lens, this einzel lens may be an einzel lens constituted with three electrodes.

The beam focusing unit 304 may be any beamline component capable of controlling the focal position of the ion beam and therefore may be the extraction electrode 218 (e.g., see FIG. 6) or the mass analyzing magnet 202 (e.g., see FIG. 5A). The focal position of the ion beam entering the beam scanning unit 306 may be adjusted such that, for example, the voltage of the extraction electrode 218, the position of the extraction electrode 218 in a beam traveling direction, and/or the face angle of the mass analyzing magnet 202 are/is adjusted.

Thus, the beam focusing unit 304 may include at least one of a beam focusing element (e.g., the Q lens, the einzel lens, etc.), the extraction electrode and the mass analyzing magnet. In this case, the beam focusing unit 304 is regarded as another beamline component different from the beam scanning unit 306.

Alternatively, the beam focusing unit 304 may be configured as a part of the beam scanning unit 306. In other words, the configuration may be such that the beam scanning unit 306 itself adjusts the focal position of the ion beam entering the beam scanning unit 306. The beam scanning unit 306 may be so configured as to provide a beam focusing action in combination with a deflecting action for the scanning purpose. For example, the focal position of the ion beam entering the beam scanning unit 306 may be adjusted by using one or more correction electrodes that is/are arranged near one or more scanning electrodes to correct a so-called zero electric field effect.

The beam divergence measurement unit 310 is configured to measure a beam divergence at the position of a workpiece or a position near the workpiece. Thus, the beam divergence measurement unit 310 includes a measuring device for measuring the angular distribution of ion beam. The measuring device measures, in advance, the angular distribution of the ion beam at the position of a workpiece (e.g., the wafer 214), into which the ion beam is implanted, or at the measurement position near the workpiece. Then, during an ion implantation process, the measuring device either stops the measurement by retreating from the measurement position or monitors the ion beam near the measurement position.

Such a measuring device for measuring the beam angular distribution may include a slit located at a predetermined position and a beam detector placed downstream of the slit. The beam detector may have a one-dimensional array of beam detecting elements or a two-dimensional array of beam detecting elements. The angle of beam traveling direction can be acquired from a positional relation between a beam arrival point, detected by the beam detector, and the slit. The detector may be movable in a plane perpendicular to the beam central trajectory (e.g., in the beam scanning direction) and may measure the angular distribution at any position in this plane.

The beam divergence measurement unit 310 may be arranged between the beam parallelizing unit 308 and the workpiece, and may measure the beam divergence at a position located upstream of the workpiece. Alternatively, the beam divergence measurement unit 310 may be arranged behind the workpiece and may measure the beam divergence at a position located downstream of the workpiece.

The ion implantation apparatus 300 includes a beam divergence control unit 312. The beam divergence control unit 312 may be the above-described control unit 116 (see FIG. 2) or a part of the control unit 116. The beam divergence control unit 312 is configured such that the focal position of an ion beam entering the beam scanning unit 306 is adjusted on the basis of the beam divergence measured by the beam divergence measurement unit 310. For example, the beam divergence control unit 312 compares the beam divergence measured by the beam divergence measurement unit 310 against a desired value and then adjusts the focal position of an incident ion beam into the beam scanning unit 306 such that the measured beam divergence corresponds to the desired value.

The beam divergence control unit 312 sends instructions to the beam focusing unit 304 (and/or the beam scanning unit 306), based on the angular information measured. With the instructions sent therefrom, the beam focusing force of the beam focusing unit 304 (and/or the beam scanning unit 306) is controlled so as to change the focal position of the ion beam. As a result, an intended beam divergence can be obtained at a wafer position.

The beam divergence control unit 312 determines a parameter for the beam focusing unit 304 (and/or the beam scanning unit 306) based on the measurement result of the beam angular distribution, for instance. The measurement result may be measured by using the beam angular distribution measuring device located at the wafer position immediately before the beam is implanted into the wafer.

Figure 17:
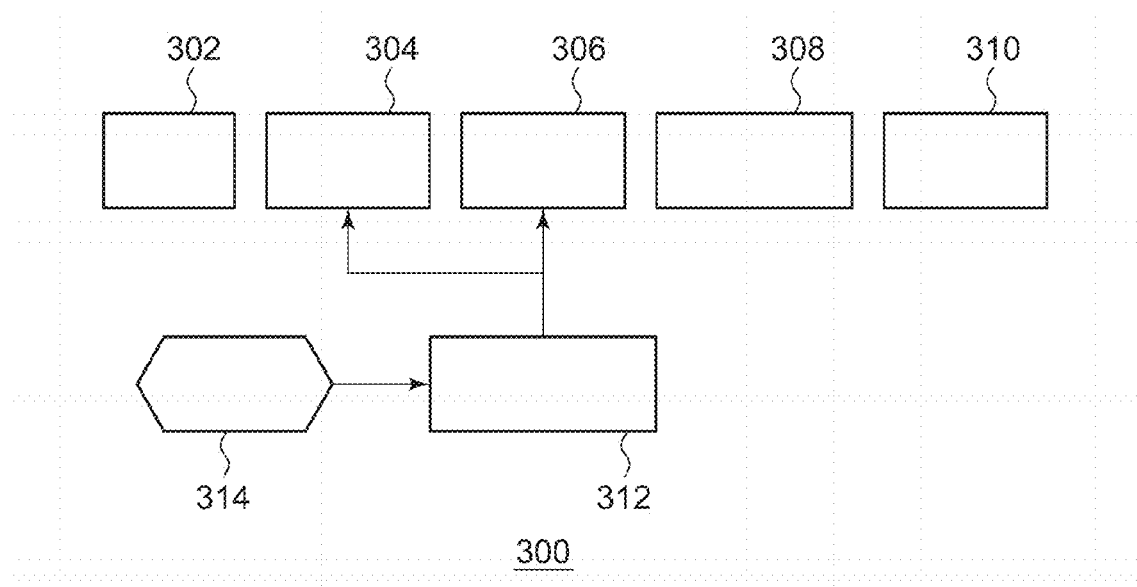
FIG. 17 schematically shows a structure of an ion implantation apparatus according to an embodiment of the present invention.

Alternatively, as shown in FIG. 17, the parameter with which to control the focal position of the ion beam may be determined by utilizing a function or a table 314 involving beam conditions such as the ion species, energy, beam current and the like. The function or the table 314 may be defined beforehand based on the result of the beam angular distribution obtained by the beam angular distribution measuring device. The function or the table 314 may be stored in the beam divergence control unit 312 or a storage unit attached thereto.

A focus adjustment process according to the present embodiment may be carried out in a preparatory stage of ion implantation. For example, the focus adjustment process may be carried out during selecting step (S10) of the beamline setting shown in FIG. 4 or during the beam emission and adjustment (S106) shown in FIG. 10. The focus adjustment process according to the present embodiment may be carried out during the ion implantation.

Figure 18:
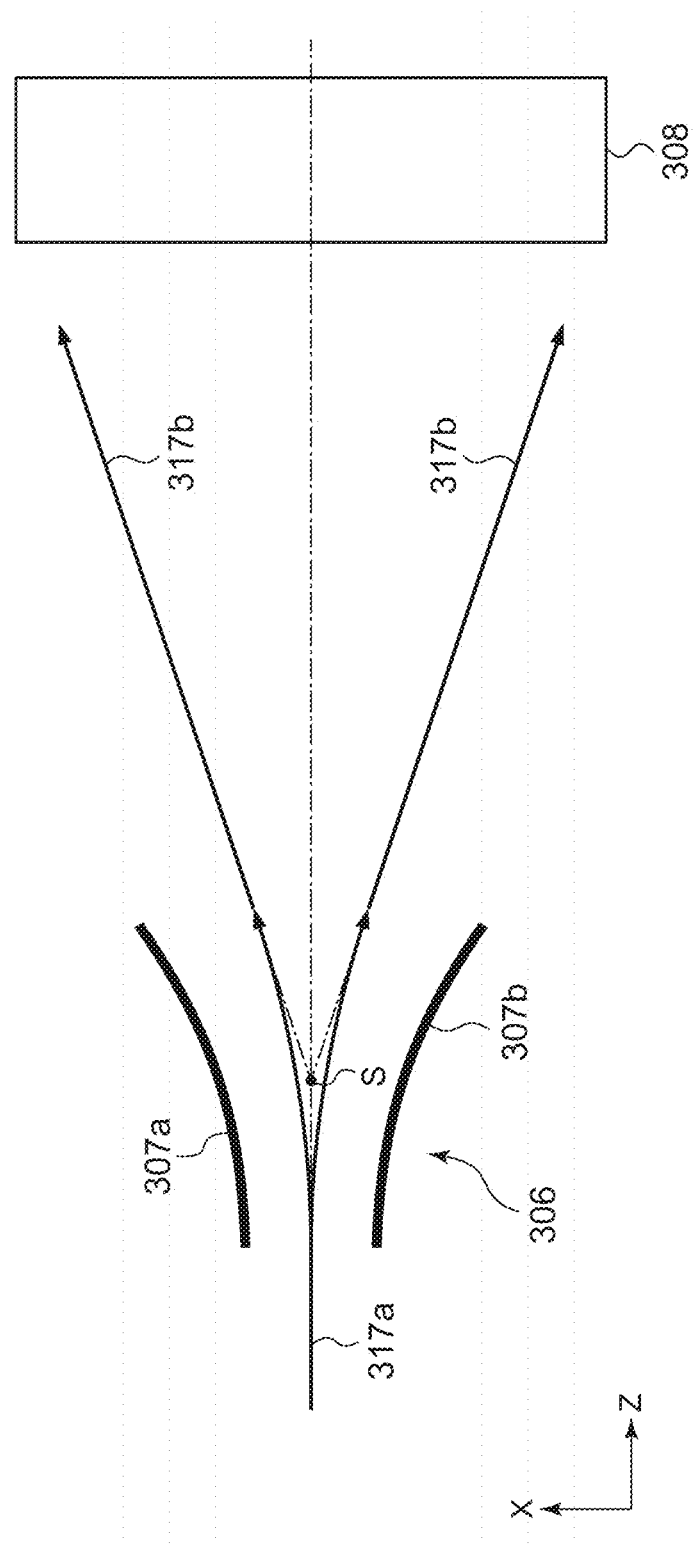
FIG. 18 schematically shows a scan origin of a beam scanning unit.

FIG. 18 schematically shows a scan origin S of the beam scanning unit 306. The beam scanning unit 306 is configured such that ion beam is deflected in the X direction, at the scan origin S, with a periodically varying deflection angle. As illustrated in FIG. 18, the scan origin S is an intersection point of an extended line of an incident ion beam trajectory 317a into the beam scanning unit 306 and extended lines of beam trajectories 317b exiting from the ion beam scanning unit 306. As described earlier, the scan origin S of the beam scanning unit 306 coincides with the focal point of the parallelizing lens in the beam parallelizing unit 308.

The beam scanning unit 306 is, for example, a deflection scanning device that scans the ion beam periodically and reciprocatingly in the X direction by the periodically varying electric field. As illustrated in FIG. 18, the beam scanning unit 306 includes a pair of (two) scan electrodes 307a and 307b (bipolar deflection scan electrodes) that are so arranged as to face each other with an ion beam passage region located between the scan electrodes 307a and 307b in the beam traveling direction. The scan origin S is positioned between the scan electrodes 307a and 307b. The applied voltages to the respective scan electrodes 307a and 307b have opposite sign values from each other to provide a scan voltage therebetween in the form of an approximately triangular wave varying alternately between a positive value and a negative value at a predetermined frequency in the range of 0.5 Hz to 4000 Hz. The scan voltage generates the varying electric field that deflects a beam passing through a space between the two scan electrodes 307a and 307b. Then, the beam that passes through the space is scanned in the X direction by a periodic change in the scan voltage.

Figure 19A:
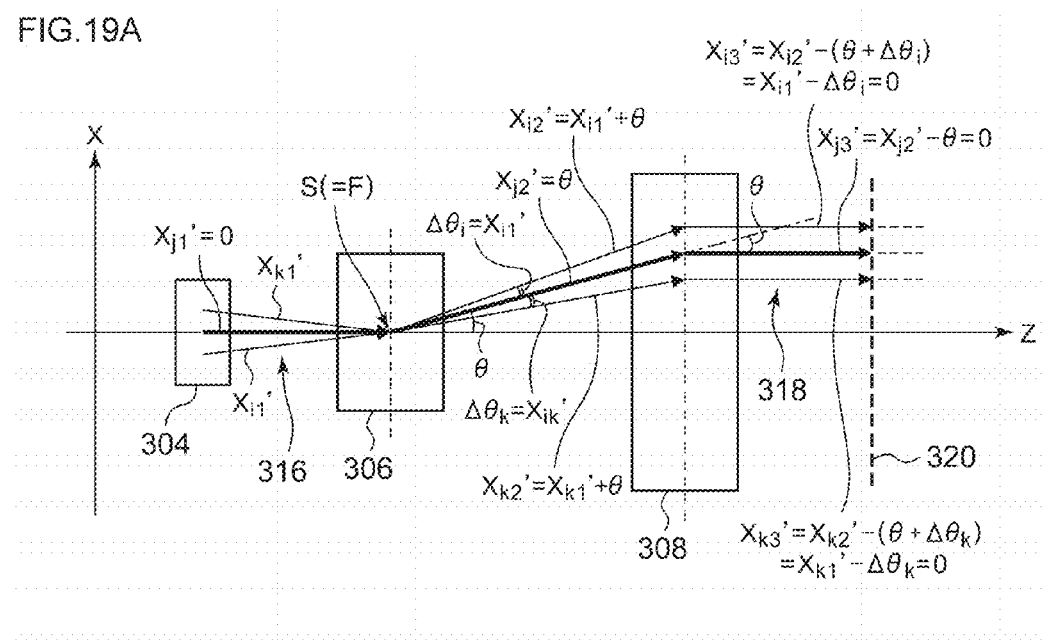
FIGS. 19A and 19B are diagrams for explaining a relationship between the adjustment of focal point of ion beam and a beam divergence.
Figure 19B:
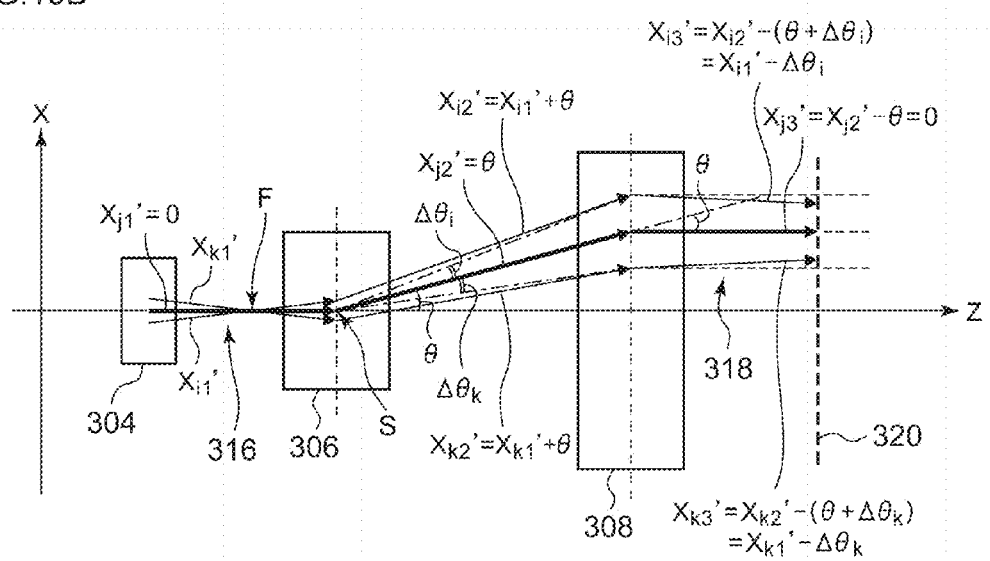
Figure 20A:
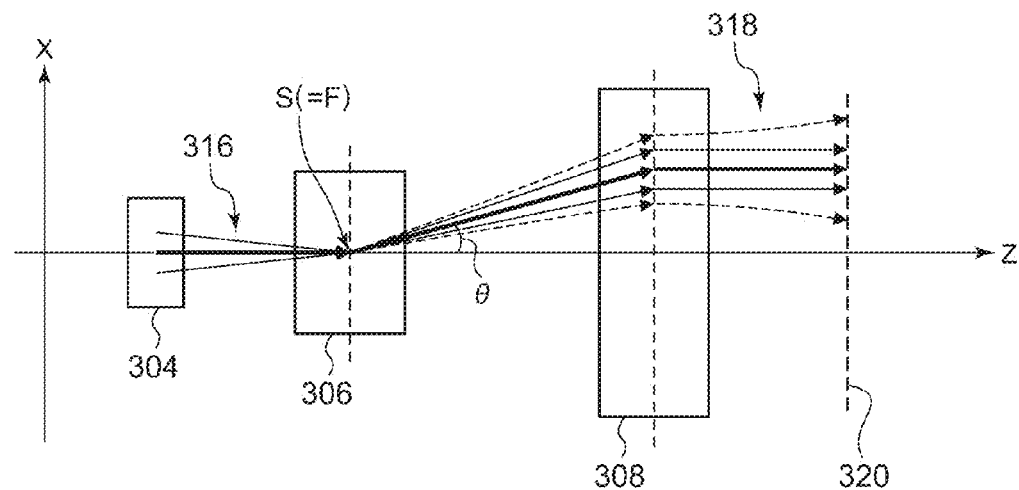
FIGS. 20A and 20B are diagrams for explaining a relationship between the adjustment of focal point of ion beam and a beam divergence.
Figure 20B:
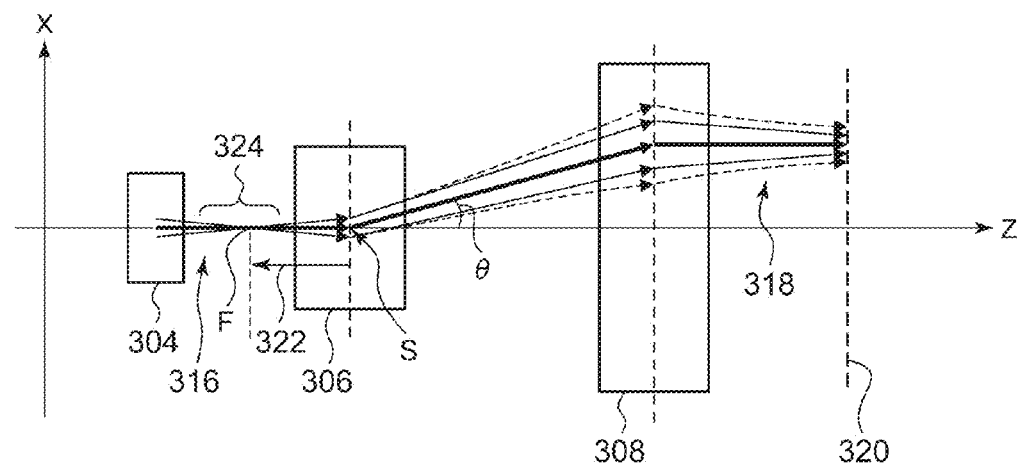

Referring to FIGS. 19A and 19B and FIGS. 20A and 20B, a description is now given of a relationship between the adjustment of the focal position of ion beam and the beam divergence. For simplicity, a description is first given of a case where no space charge effect is taken into consideration (FIGS. 19A and 19B) followed by a case where the space charge effect exists (FIGS. 20A and 20B). In these two cases, comparison is made between when the focal position of the ion beam entering the beam scanning unit 306 is located at the scan origin S (FIG. 19A and FIG. 20A) and when the focal position thereof is located upstream of the scan origin S (FIG. 19B and FIG. 20B).

In the following description, for convenience, an ion beam entering the beam scanning unit 306 may be referred to as an "incident ion beam 316". Similarly, an ion beam exiting from the beam parallelizing unit 308 may be referred to as an "exiting ion beam 318". The focal position of the incident ion beam 316 may be referred to as a "beam focal position F".

As illustrated in FIG. 19A, all ions of the incident ion beams 316 focused on the scan origin S are radiated from the scan origin S (i.e., the focal point of the beam parallelizing unit 308) and therefore all ions thereof become parallel by the beam parallelizing unit 308. This makes the beam divergence of the exiting ion beam 318 a small value (ideally zero). Since no repulsive forces is generated when no space charge effect is assumed to exist, all ions of the exiting ion beams 318 from the beam parallelizing unit 308 remain parallel at a wafer position 320

This will now be explained in more detail. When an i-th ion (hereinafter referred to as "ion(i)") enters the beam scanning unit 306 at an incidence angle $X_{i1}'$ and is deflected, at the scan origin S, with a certain angle θ, an exiting angle $X_{i2}'$ of the ion(i) exited from the beam scanning unit 306 is expressed by $$X_{i2}' = X_{i1}' + \theta.$$

An angle formed by a straight line, connecting an "incident position into the beam parallelizing unit 308" of the ion(i) and the "scan origin S", with the Z axis (i.e., a central axis of the incident ion beam 316) can be expressed as $\theta + \Delta\theta_i$. In this case, an angle of the ion(i) deflected by the beam parallelizing unit 308 is $-(\theta + \Delta\theta_i)$ having the opposite sign value of the aforementioned angle $\theta + \Delta\theta_i$. Thus, an angle $X_{i3}'$ of the ion(i) in the exiting ion beam 318 (i.e., an angle of the ion(i) that has passed through the beam parallelizing unit 308) becomes as follows.

$$X_{i3}' = X_{i2}' - (\theta + \Delta\theta_i) = X_{i1}' - \Delta\theta_i$$

When, as shown in FIG. 19A, the beam focal position F corresponds to the scan origin S, $\Delta\theta_i = X_{i1}'$ holds. Hence, the angle $X_{i3}'$ of the ion(i) in the exiting ion beam 318 becomes zero. In other words, the traveling direction of the ion(i) that has exited from the beam parallelizing unit 308 becomes parallel to the designed central trajectory (Z axis). Similarly, the other ions exiting therefrom become parallel to the Z axis.

However, in reality, the space charge effect is effective. As a result, as exemplified by a dashed arrow shown in FIG. 20A, the exiting ion beam 318 spreads as it is transported toward a downstream side. Then the exiting ion beam 318 becomes a divergent beam at the wafer position 320. This makes the beam divergence of the exiting ion beam 318 a large positive value. For comparison, a solid arrow in FIG. 20A shows the exiting ion beam 318 where the space charge effect is ignored as shown in FIG. 19A. Since the centroid position of the angular distribution of the ion beam is not affected by the space charge effect, the "beam parallelism" remains the same for both when the space charge effect is taken into consideration (FIG. 20A) and when it is not (FIG. 19A).

FIG. 19B shows a case where the beam focal position F is located upstream of the scan origin S. When the ion(i) enters the beam scanning unit 306 at the incidence angle $X_{i1}'$ similarly to the case exemplified in FIG. 19A, the angle $X_{i3}'$ of the ion(i) in the exiting ion beam 318 is $$X_{i3}' = X_{i1}' - \Delta\theta_i.$$

Since $X_{i1}' < \Delta\theta$, $X_{i3}' < 0$. Considering similarly a k-th ion (hereinafter referred to as "ion(k)") positioned in the opposite side of the ion(i) with respect to the central axis of beam, $X_{k3}' > 0$ because $X_{k1}' > \Delta\theta_k$.

In this manner, when the beam focal position F is located upstream of the scan origin S, the exiting ion beam 318 becomes a convergent beam. Thus, the beam divergence of the exiting ion beam 318 is negative and is larger in absolute value than when the beam focal position F is located at the scan origin S. If it is assumed that no space charge effect exists, such a convergent beam will reach the wafer position 320.

However, in reality, a divergence action by the space charge effect works on the exiting ion beam 318 as exemplified by a dashed arrow shown in FIG. 20B. Thus, consideration of this divergence action allows the beam divergence of the exiting ion beam 318 to be compensated. For comparison, a solid arrow in FIG. 20B shows the exiting ion beam 318 where the space charge effect is ignored as shown in FIG. 19B. Since the centroid position of the angular distribution of the ion beam is not affected by the space charge effect, the "beam parallelism" remains the same for both when the space charge effect is taken into consideration (FIG. 20B) and when it is not (FIG. 19B).

The beam focal position F is shifted toward an upstream side from the scan origin S such that Δθ with which to cancel out the influence of the actually working space charge effect can be obtained. This allows the ion beam to be parallelized at the wafer position 320. Alternatively, the ion beam can be controlled such that the ion beam has an intended beam divergence, by appropriately displacing or shifting the beam focal position F toward an upstream or downstream side from the scan origin S. This means that, for example, a beam having a small divergence can be obtained.

As described above, the ion implantation apparatus 300 is configured such that the beam focal position F of the incident ion beam 316 into the beam scanning unit 306 can be tuned, at a position upstream of the scan origin S, along the central axis of the incident ion beam 316. FIG. 20B exemplifies a displacement 322 of the beam focal position F toward an upstream side from the scan origin S and an adjustable range 324 of the beam focal position F by using the beam focusing unit 304. Such an adjustment of the focal point like this allows the ion implantation apparatus 300 to compensate the divergence phenomenon caused by the space charge effect in the exiting ion beam 318 from the beam parallelizing unit 308. As a result, the implantation processing can be carried out using the thus compensated ion beam.

Describing it from a different point of view, the beam parallelizing unit 308 is configured such that the scanned ion beam is completely or incompletely parallelized in consideration of the space charge effect working on an ion beam during a transportation of the ion beam from the beam parallelizing unit 308 to the workpiece. For example, the beam parallelizing unit 308 gives out the incompletely parallelized ion beam toward the workpiece such that the ion beam implanted into the surface of the workpiece is completely parallelized by the influence of the space charge effect. Or the beam parallelizing unit 308 gives out the completely or incompletely parallelized ion beam toward the workpiece such that the ion beam implanted into the surface of the workpiece has a desired beam divergence by the influence of the space charge effect.

Arranging the beam focal position F in a position upstream of the scan origin S as in the present embodiment is suitable for the transportation of a high-current ion beam. This is because a relatively large space charge effect is produced in the high-current ion beam. Thus, in an embodiment, the beam focal position F of the incident ion beam 316 may be located at a first focal position upstream of the beam focal position F, in the above-described first beamline setting S1 (see FIG. 2) or the above-described first implantation setting configuration. Also, the beam focal position F of the incident ion beam 316 may be located at a second focal position, which differs from the first focal position, in the above-described second beamline setting S2 (see FIG. 2) or the above-described second implantation setting configuration. The second focal position may coincide with the scan origin S.

In an embodiment, the ion implantation apparatus is configured such that the beam focal position of the incident ion beam into the beam scanning unit can be adjusted, at a position downstream of the scan origin, along the central axis of this incident ion beam. In such a case, the control unit of the ion implantation apparatus may be configured to compare the beam divergence of the exiting ion beam, measured by the measurement unit for measuring the beam divergence, out from the beam parallelizing unit, against a desired value and, thereafter, to adjust the beam focal position of the incident ion beam into the beam scanning unit, at a position downstream of the scan origin, along the central axis of this incident ion beam, such that the beam divergence corresponds to the desired value.

It should be understood that the invention is not limited to the above-described embodiment, but may be modified into various forms on the basis of the spirit of the invention. Additionally, the modifications are included in the scope of the invention.

What is claimed is:

1. An ion implantation apparatus comprising:
  a beam scanning unit that has a scan origin in a central part of the beam scanning unit on a central axis of an incident ion beam; and
  a beam parallelizing unit arranged downstream of the beam scanning unit, the beam parallelizing unit that has a focal point of a parallelizing lens at the scan origin,
  wherein the ion implantation apparatus is configured such that a focal position of the incident ion beam into the beam scanning unit is located upstream of the scan origin along the central axis of the incident ion beam, and
  wherein the focal position of the incident ion beam toward the beam scanning unit is adjusted to be at a position upstream of the scan origin along the central axis of the incident ion beam in such a manner that a divergence phenomenon caused by a space charge effect in an exiting ion beam from the beam parallelizing unit is compensated.

2. The ion implantation apparatus according to claim 1, further comprising:
  a measurement unit that measures a beam divergence indicating both an extent of spread of angular distribution of the exiting ion beam and a state of beam convergence/divergence of the exiting ion beam; and
  a control unit that compares the beam divergence of the exiting ion beam measured by the measurement unit against a desired value and adjusts the focal position of the incident ion beam along the central axis such that the beam divergence corresponds to the desired value.

3. The ion implantation apparatus according to claim 1, further comprising a beam focusing unit that adjusts the focal position of the incident ion beam along the central axis, the beam focusing unit being arranged upstream of the beam scanning unit.

4. The ion implantation apparatus according to claim 1, wherein the beam scanning unit is configured to adjust the focal position of the incident ion beam along the central axis.

5. The ion implantation apparatus according to claim 1, wherein ion implantation apparatus operates under one of a plurality of implantation setting configurations including a first implantation setting configuration suitable for a transportation of a low energy/high current beam tuned for a high dose implantation into a workpiece, and a second implantation setting configuration suitable for a transportation of a high energy/low current beam tuned for a low dose implantation into a workpiece,
  wherein the incident ion beam has a first focal position in the first implantation setting configuration, and the incident ion beam has a second focal position, which differs from the first focal position, in the second implantation setting configuration.

6. An ion implantation apparatus comprising:
a beam scanning unit that has a scan origin in a central part of the beam scanning unit on a central axis of an incident ion beam;
a beam parallelizing unit arranged downstream of the beam scanning unit, the beam parallelizing unit that has a focal point of a parallelizing lens at the scan origin;
a measurement unit that measures a beam divergence indicating both an extent of spread of angular distribution of an exiting ion beam from the beam parallelizing unit and a state of beam convergence/divergence of the exiting ion beam; and
a control unit that compares the beam divergence of the exiting ion beam measured by the measurement unit against a desired value and adjusts a focal position of the incident ion beam toward the beam scanning unit along the central axis of the incident ion beam such that the beam divergence corresponds to the desired value.

7. An ion implantation method employed in an ion implantation apparatus comprising a beam scanning unit that has a scan origin in a central part of the beam scanning unit on a central axis of an incident ion beam, and a beam parallelizing unit arranged downstream of the beam scanning unit, the beam parallelizing unit that has a focal point of a parallelizing lens at the scan origin, the method comprising:
scanning the incident ion beam by the beam scanning unit;
deflecting the scanned ion beam by the beam parallelizing unit; and
adjusting a focal position of the incident ion beam to be at a position upstream of the scan origin along the central axis of the incident ion beam in such a manner that a divergence phenomenon caused by a space charge effect in an exiting ion beam from the beam parallelizing unit is compensated.

8. An ion implantation method employed in an ion implantation apparatus comprising a beam scanning unit that has a scan origin in a central part of the beam scanning unit on a central axis of an incident ion beam, and a beam parallelizing unit arranged downstream of the beam scanning unit, the beam parallelizing unit that has a focal point of a parallelizing lens at the scan origin, the method comprising:
scanning the incident ion beam by the beam scanning unit;
deflecting the scanned ion beam by the beam parallelizing unit;
measuring a beam divergence indicating both an extent of spread of angular distribution of an exiting ion beam from the parallelizing lens and a state of beam convergence/divergence of the exiting ion beam; and
comparing the measured beam divergence of the exiting ion beam against a desired value, and thereafter, adjusting a focal position of the incident ion beam toward the beam scanning unit along the central axis of the incident ion beam such that the beam divergence corresponds to the desired value.

* * * * *